United States Patent

Muraoka et al.

[11] Patent Number: 6,140,247
[45] Date of Patent: *Oct. 31, 2000

[54] SEMICONDUCTOR DEVICE MANUFACTURING METHOD

[75] Inventors: Kouichi Muraoka, Yokohama; Iwao Kunishima, Kawasaki, both of Japan; Hirotaka Nishino, Pittsburgh, Pa.

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/613,087

[22] Filed: Mar. 8, 1996

[30] Foreign Application Priority Data

| | | | |
|---|---|---|---|
| Mar. 10, 1995 | [JP] | Japan | 7-051284 |
| Mar. 30, 1995 | [JP] | Japan | 7-072667 |
| Feb. 27, 1996 | [JP] | Japan | 8-039272 |

[51] Int. Cl.[7] .............................. C03C 15/00; B44C 1/22
[52] U.S. Cl. ........................ 438/743; 438/694; 438/703; 438/906
[58] Field of Search .................................. 438/694, 703, 438/906, 743

[56] References Cited

U.S. PATENT DOCUMENTS

| | | | |
|---|---|---|---|
| 2,948,642 | 8/1960 | MacDonald | 148/1.5 |
| 4,749,440 | 6/1988 | Blackwood et al. | 156/646 |
| 4,857,142 | 8/1989 | Syverson | 156/646 |
| 5,073,232 | 12/1991 | Ohmi et al. | 156/646 |
| 5,439,553 | 8/1995 | Grant et al. | 216/58 |
| 5,693,578 | 12/1997 | Nakanishi et al. | 437/238 |
| 5,716,495 | 2/1998 | Butterbaugh et al. | 156/643.1 |
| 5,922,624 | 7/1999 | Verhaverbeke | 438/743 |

FOREIGN PATENT DOCUMENTS

| | | |
|---|---|---|
| 2-106927 | 4/1990 | Japan . |
| 3-253032 | 11/1991 | Japan . |
| 4-96226 | 3/1992 | Japan . |

OTHER PUBLICATIONS

Wolf, Stanley, Silicon Processing for the VLSI Era, vol. 1, pp. 516–520, 1986.
Wolf, Stanley, Silicon Processing for the VLSI Era, vol. 2, pp. 21–26, 1990.
Ghandhi, Sorab, VLSI Fabrication Principles, p. 373, 1983.
Extended Abstracts of the 1991 International Conference on Solid State Devices and Materials, pp. 496–498, 1991, B.E. Deal, et al., "New Techniques in Vapor Phase Wafer Cleaning".
J. Vac. Sci. Technol., vol. 10, No. 4, pp. 806–811, Jul./Aug. 1992, C.R. Helms, et al., "Mechanisms of the HF/H$_2$O Vapor Phase Etching of SiO$_2$".
J. Electrochem. Soc., vol. 140, No. 4, pp. L64–L66, Apr. 1993, J. Ruzyllo, et al., "Etching of Thermal Oxides in Low Pressure Anhydrous HF/CH$_3$OH Gas Mixture at Elevated Temperature".

Primary Examiner—Charles Bowers
Assistant Examiner—Lisa Kilday
Attorney, Agent, or Firm—Oblon, Spivak, McClelland, Maier & Neustadt, P.C.

[57] ABSTRACT

A semiconductor device manufacturing method includes the step of forming a silicon oxide film on the surface of a silicon region, and the step of supplying anhydrous hydrofluoric acid gas to the silicon oxide film, thereby removing the silicon oxide film. The total concentration of Si—H bonds, Si—O—H bonds, and H$_2$O molecules, in the silicon oxide film is $1 \times 10^{13}/cm^2$ or more.

18 Claims, 11 Drawing Sheets

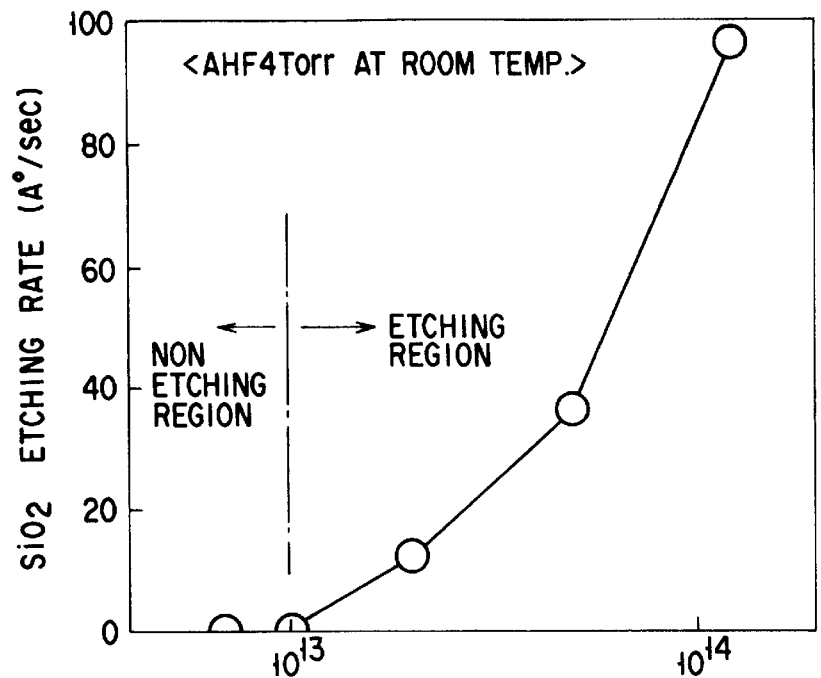
F I G. 2  CONCENTRATION OF Si-H, Si-OH AND $H_2O$ IN $SiO_2$ LAYER (pcs/cm²)
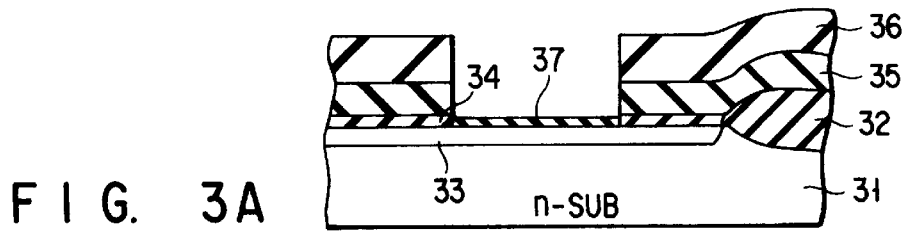
F I G. 3A
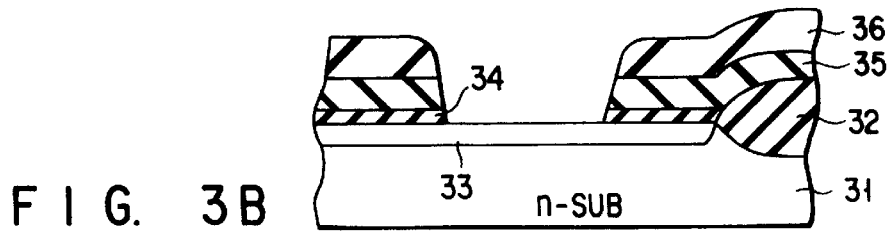
F I G. 3B
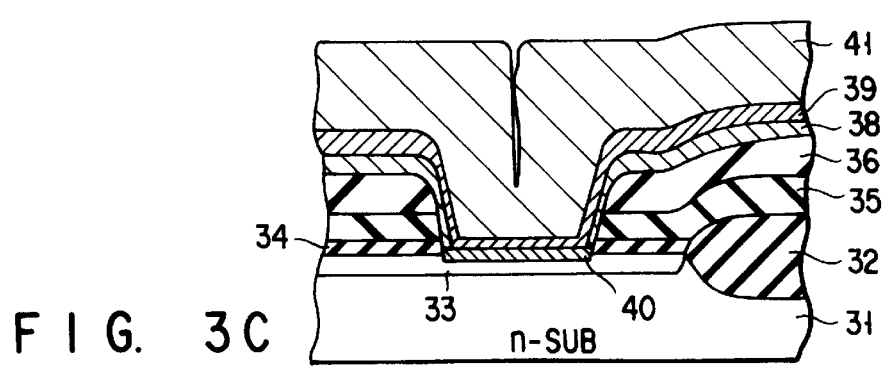
F I G. 3C

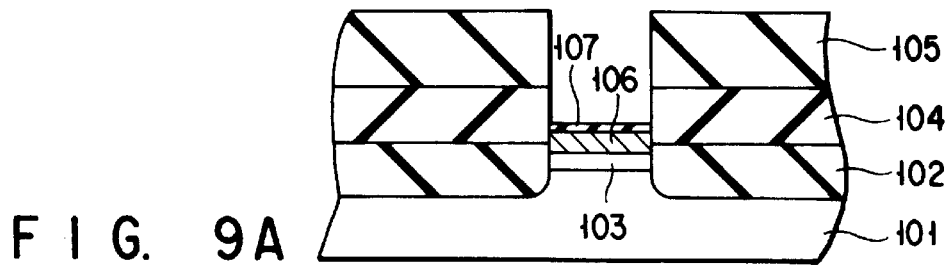
F I G. 9A
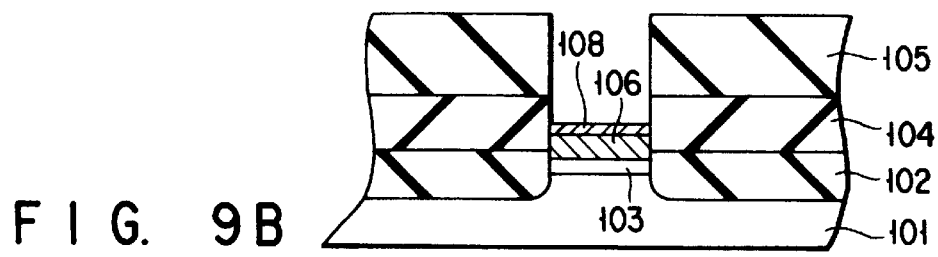
F I G. 9B
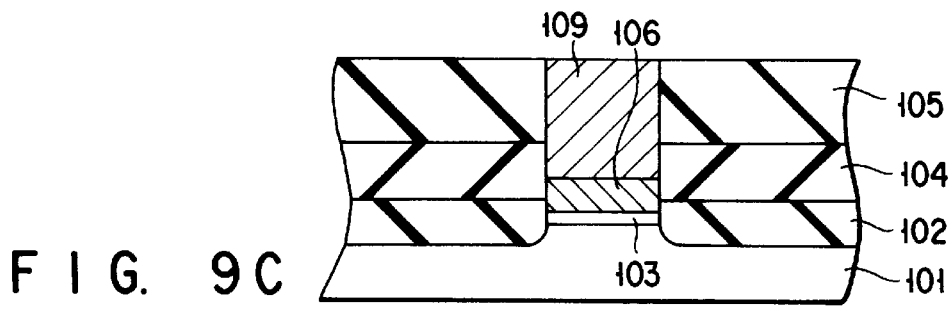
F I G. 9C
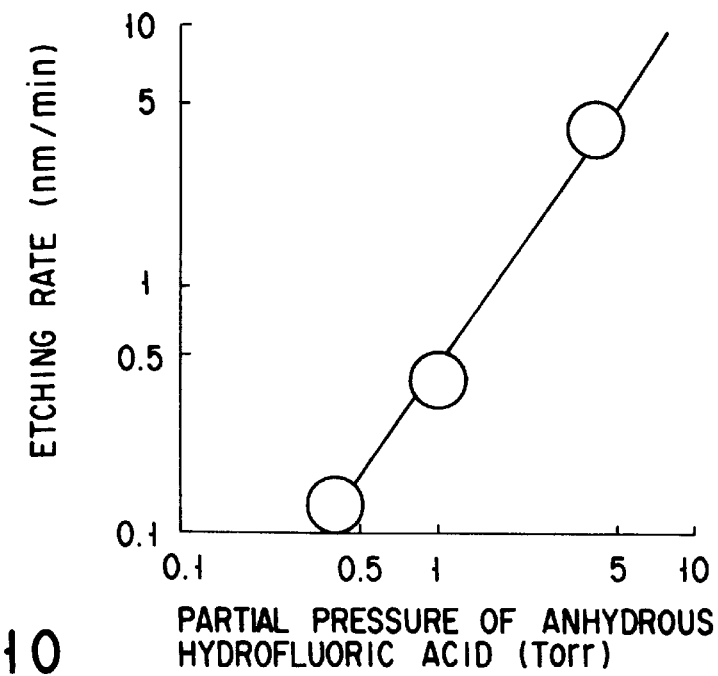
F I G. 10

SEMICONDUCTOR DEVICE MANUFACTURING METHOD

BACKGROUND OF THE INVENTION

1. Field of the Invention

The present invention relates to a semiconductor device manufacturing method and, more particularly, to a method of removing a silicon oxide film on a silicon region or a silicide region.

2. Description of the Related Art

Along with an increase in packing density of a silicon device, cleaning in accordance with a dry process, e.g., dry etching, that performs processing in a vacuum is attracting attention to replace cleaning of the surface of a silicon substrate in accordance with a wet process that performs processing in a solution, e.g., dilute hydrofluoric acid processing. According to the wet process, the substrate must be exposed to the atmosphere after processing, causing problems such as microparticle contamination, organic compound contamination, reoxidation of the substrate surface, and the like. In contrast to this, according to the dry process, since processing can be easily performed in a high vacuum continuously, the clean surface can be maintained, thereby solving the problems of the wet process.

For example, in a NAND type EEPROM, an increase in reliability of a tunnel oxide film is strongly demanded. In this case, in the process including pre-processing of the substrate, formation of the tunnel oxide film, and formation of poly-Si, cleaning of the substrate surface before formation of the oxide film is important, and an increase in reliability in accordance with dry pre-processing is expected.

As a method of removing a silicon oxide film at room temperature, HF-Vapor (HF/$H_2O$ vapor) process is conventionally reported. According to this method, the oxide film is removed by, e.g., the following process. First, an 800-nm thick field oxide film is formed by thermal oxidation on the surface of an n-type silicon substrate having a (100) plane as a major surface. To remove the organic contamination on the surface of the silicon substrate, processing with a mixed solution of sulfuric acid and hydrogen peroxide (to be referred to as SH processing hereinafter) is performed. As a chemical oxide is formed on the surface of the silicon substrate by the SH processing, it is removed by dilute hydrofluoric acid processing.

Subsequently, in order to remove metal contamination on the exposed surface of the silicon substrate, processing with a mixed solution of hydrochloric acid and hydrogen peroxide (to be referred to as SC2 processing hereinafter) is performed. By the SC2 processing, the surface of the silicon substrate is covered with a chemical oxide again.

After these processing operations employing solutions, the substrate is transferred into a chamber, and the chemical oxide is removed by HF-vapor (HF/$H_2O$ vapor) processing. In the HF-vapor processing, $N_2$ gas is supplied into an aqueous hydrofluoric acid buffer solution by bubbling, and the obtained $N_2$ gas containing the HF/$H_2O$ vapor is blown to the substrate maintained at room temperature.

Thereafter, a tunnel oxide film and a poly-Si layer are formed by continuous incineration oxidation using $O_2/H_2$ and $SiH_4$ gas, respectively, in the same chamber, and the silicon substrate is unloaded from the chamber. By this processing, the concentrations of impurities, e.g., organic matter, can be decreased in the interfaces of the poly-Si layer/$SiO_2$ layer (tunnel oxide film)/Si substrate stacked structure.

However, recent intensive studies have made it apparent that the above method causes problems as follows. When the chemical oxide is removed in accordance with the HF-Vapor process, since an aqueous solution of HF is employed, particles, e.g., $Si(OH)_x$ particles as the reaction product of the silicon oxide film and water, remain on the surface of the substrate, to cause morphological degradation during formation of the tunnel oxide film and poly-Si layer that follows. It has become apparent that, in order to solve this problem, rinsing with water shower must be performed as a particle removing step.

When the native oxide film is removed by the conventional wet process using dilute hydrofluoric acid or the HF-Vapor process described above, selectivity against the thermal oxide film cannot be obtained. Thus, if a different oxide film, e.g., a contact region, exists on the substrate, not only the native oxide film but also the other oxide films are entirely etched undesirably, thereby largely changing the contact diameter, the aspect ratio, and the like.

Furthermore, when the aqueous HF solution is exposed to a metal, HF forms active $HF_2^-$ and $F^-$ on the surface of the metal. This brings about rapid fluoridization of the metal, thus corroding the metal. This phenomenon inflicts large damages to the interior of the chamber, the pipes, the exhaustion system, and the like.

As the partial pressure of the background water in the chamber is high, $H_2O$ is mixed in the process gas in the following step, e.g., oxidation step. Then, the formed film contains oxygen and hydrogen to degrade the film quality. For this reason, in order to decrease the partial pressure of the water in the atmosphere, evacuation as a transient step to the following process must be performed for a long period of time, resulting in an increase in process time.

As described above, in the conventional oxide removing method, particles are formed on the surface of the silicon substrate to cause morphological degradation, and the evacuation time is prolonged to increase the process time.

As the operational speed and the integration degree of the LSIs increase, the packing density of the electrodes and wires increases. An increase in packing density of the electrodes and wires entails an increase in resistance. For this reason, metal silicides are currently widely used as the material of the electrodes and wires.

For example, conventional contact electrode formation using a metal silicide is performed in the following manner. First, an 800-nm thick field oxide film is formed by thermal oxidation on the surface of an n-type silicon substrate having a (100) plane as a major surface. $BF_2^+$ ions are implanted in the surface of the n-type silicon substrate in an element formation region surrounded by the field oxide film with an acceleration voltage of 35 eV and a dose of $5 \times 10^{15}$ cm$^{-2}$. The n-type silicon substrate is then heated to 1,000° C. for 20 seconds in an $N_2$ atmosphere, thereby forming a shallow $p^+$-type diffusion layer having a thickness of about 0.1 μm.

A stacked layer consisting of a CVD-$SiO_2$ film and a BPSG film is deposited as an insulating interlayer film on the entire surface to a thickness of 1.0 μm. This stacked film is etched to form a contact hole on the $p^+$-type diffusion layer. Then, the n-type silicon substrate is washed with an aqueous dilute hydrofluoric acid solution to separate the native oxide film on the surface of the $p^+$-type diffusion layer.

The n-type silicon substrate is transferred into a vacuum unit. A stacked film consisting of a 30-nm thick Ti film and a 70-nm thick TiN film is formed on the silicon substrate by continuous sputtering. Silicidation in accordance with RTA (Rapid Thermal Anneal) processing is performed at 750° C.

for 30 seconds. Non-reacted portions of the Ti and TiN films are removed by processing with a mixed solution of sulfuric acid and hydrogen peroxide. As a result, a 60-nm thick $TiSi_2$ layer is formed on only the $p^+$-type diffusion layer in self alignment. At this time, a $SiO_x$ layer having a thickness of about 4 nm is formed on the $TiS_2$ layer. This is because a silicon oxide and the like can be easily formed on the surface of the metal silicide by water and oxygen in the atmosphere or by chemical processing with, e.g., a mixed solution of sulfuric acid and hydrogen peroxide.

The $SiO_x$ layer causes an increase in contact resistance and separation of a W film which is formed in the following step and thus must be removed. Therefore, the $SiO_x$ layer is removed by RIE (Reactive Ion Etching) using $BCl_3$ gas.

Subsequently, the $TiSi_2$ layer is heated to 350° C., and monosilane ($SiH_4$) and tungsten hexafluoride ($WF_6$) are supplied to the n-type silicon substrate, thereby selectively forming a W layer on the $TiSi_2$ layer. For example, the flow rate, total pressure, and supply time of monosilane and tungsten hexafluoride are in both cases 10 sccm, 0.15 Torr, and 60 seconds.

However, recent intensive studies have made it apparent that the above method has problems as follows. In removal of the $SiO_x$ layer 125 by RIE using $BCl_3$ gas, if the aspect ratio of the contact hole is high, a microloading effect occurs in which ions collide against the side wall of the contact hole due to charge-up of the $SiO_2$ film and the BPSG film. As a result, the orbits of the ions (B ions and Cl ions) serving as the etchants are bent, so that the amount of ions reaching the bottom portion of the contact hole decreases. As the $SiO_x$ layer undesirably remains on the edge region of the bottom surface of the contact hole, the W layer easily separates undesirably.

Furthermore, in above-described removal of the $SiO_x$ layer, as high-energy ions, e.g., B ions and Cl ions, in the $BCl_3$ plasma are implanted in the $TiSi_2$ layer, the $TiSi_2$ layer is damaged, thereby increasing the contact resistance.

As described above, in the conventional contact electrode formation employing a silicide layer, as the oxides on the surface of the silicide layer are removed incompletely, the conductive film formed on the silicide film easily separates undesirably. In addition, the silicide layer is damaged during removal of the oxides, leading to an increase in contact resistance.

SUMMARY OF THE INVENTION

The present invention has been made in order to solve the above problems, and has as its object to provide a method of manufacturing a semiconductor device having a high reliability and high operational speed by improving pre-processing for formation of the oxide film, e.g., a tunnel oxide film, and formation of a contact.

It is another object of the present invention to provide a semiconductor device manufacturing method that can sufficiently remove oxides on the surface of a silicide layer without damaging the silicide layer.

It is still another object of the present invention to provide a novel manufacturing method that rounds the upper end portion of the contact hole in order to increase the reliability of the wiring.

In order to achieve the above objects, according to the first aspect of the present invention, there is provided a semiconductor device manufacturing method comprising:

the step of forming, on a surface of a silicon region, a silicon oxide film in which a total concentration of Si—H bonds, Si—O—H bonds, and $H_2O$ molecules contained therein is not less than $1\times10^{13}/cm^2$; and the step of supplying anhydrous hydrofluoric acid gas onto the silicon oxide film, thereby removing the silicon oxide film.

The step of forming the silicon oxide includes:

the step of forming a provisional silicon oxide film in which a total concentration of Si—H bonds, Si—O—H bonds, and $H_2O$ molecules contained therein is smaller than that of the silicon oxide film; and the step of removing the provisional silicon oxide film and newly forming the silicon oxide film with a solution containing active oxygen.

The solution containing active oxygen is preferably one member selected from the group consisting of a mixed solution of hydrochloric acid and hydrogen peroxide and a mixed solution of sulfuric acid and hydrogen peroxide.

The first silicon oxide film in which a total concentration of Si—H bonds, Si—O—H bonds, and $H_2O$ molecules contained therein is smaller than that of the silicon oxide film can be a native oxide film formed on the surface of the silicon region by a dry process.

The step of removing the silicon oxide film preferably includes the step of heating the silicon region.

After the step of removing the silicon oxide film, either one of a gate oxide film and a tunnel oxide film can be formed on the surface of the silicon region from which the silicon oxide film has been removed.

The step of forming the silicon oxide film may include:

the step of forming an insulating interlayer film formed of a silicon oxide on the silicon region;

the step of forming a contact hole, that achieves connection with the silicon region, in the insulating interlayer film by etching; and the step of forming a first silicon oxide film, in which a total concentration of Si—H bonds, Si—O—H bonds, and $H_2O$ molecules contained therein, is not less than $1\times10^{13}/cm^2$, on the surface of the silicon region on a bottom surface of the contact hole.

The step of forming the silicon oxide film preferably further includes, after the step of forming the first silicon oxide film on the surface of the silicon region, the step of forming a second silicon oxide film, in which a total concentration of Si—H bonds, Si—O—H bonds, and $H_2O$ molecules contained therein is not less than $1\times10^{13}/cm^2$, so as to cover a step portion of the contact hole.

The step of forming the second silicon oxide can include the step of forming a silicon oxide film containing fluorine by CVD, to cover the step portion of the contact hole, and causing the silicon oxide film containing fluorine to absorb $H_2O$.

The step of absorbing $H_2O$ preferably includes the step of exposing the silicon oxide film to water vapor or pure water.

In this case, after the step of removing the silicon oxide film, a contact electrode is formed on the surface of the silicon region from which the silicon oxide film has been removed.

The step of removing the silicon oxide film is preferably performed in an atmosphere having an $H_2O$ partial pressure of not more than $10^{-3}$ Torr.

According to the second aspect of the present invention, there is provided a semiconductor device manufacturing method comprising:

the step of forming an insulating interlayer film, a surface layer of which is a silicon oxide film having water absorption properties, on a silicon region;

the step of forming a contact hole, that achieves connection with the silicon region, in the insulating interlayer film by etching; and the step of rounding an upper end of the contact hole of the insulating interlayer film by using anhydrous hydrofluoric acid gas.

The method further comprises the step of forming a first silicon oxide film, in which a total concentration of Si—H bonds, Si—O—H bonds, and $H_2O$ molecules contained therein is not less than $1\times10^{13}/cm^2$, in a surface of the silicon region on a bottom surface of the contact hole, and the step of rounding the upper end of the contact hole of the insulating interlayer film may include the step of removing the first silicon oxide film formed on the surface of the silicon region by using anhydrous hydrofluoric acid gas.

The step of forming the first silicon oxide film on the surface of the silicon region includes the step of exposing the bottom portion of the contact hole to a solution containing active oxygen.

The method preferably further comprises, after the step of forming the first silicon oxide film on the surface of the silicon region, the step of forming a second silicon oxide film, in which a total concentration of Si—H bonds, Si—O—H bonds, and $H_2O$ molecules contained therein is not less than $1\times10^{13}/cm^2$, so as to cover a step portion of the contact hole, and then removing the first and the second silicon oxide film by using anhydrous hydrofluoric acid gas.

The method may further comprise the step of depositing a fluorine-doped silicon oxide film on a prospective formation region of the contact hole and thereafter making the resultant structure absorb $H_2O$ in the step of forming the silicon oxide film so as to cover the step portion of the contact hole.

The step of absorbing $H_2O$ preferably includes the step of exposing the silicon oxide film to water vapor or pure water.

The anhydrous hydrofluoric acid gas used in the present invention will be referred to as AHF gas hereinafter.

According to the semiconductor device manufacturing method of the present invention, the total concentration of Si—H bonds, Si—O—H bonds, and $H_2O$ molecules contained in the silicon oxide film or an oxide film, e.g., a chemical oxide film, formed on the surface of the silicon region is not less than $1\times10^{13}/cm^2$. Unlike the HF-Vapor process, etching can be performed without supplying water from outside but by using Si—H bonds, Si—O—H bonds, or $H_2O$ molecules contained in the silicon oxide film, thereby decreasing the amount of particles as the reaction product of the silicon oxide film and water. Furthermore, in a silicon oxide film, e.g., a thermal oxide film such as a field oxide film or a gate oxide film, or a CVD oxide film, e.g., an oxide film where a contact is to be formed, in which a total concentration of Si—H bonds, Si—O—H bonds, and $H_2O$ molecules contained in it is less than that in the oxide film, e.g., a chemical oxide film, particularly when the total concentration described above is less than $1\times10^{13}/cm^2$, only a one-molecular layer on the uppermost surface of the oxide film forms Si—F bonds and thus becomes stable against the AHF gas. Thus, only the oxide film, e.g., the chemical oxide film, described above is selectively etched. More specifically, if the total concentration of Si—H bonds, Si—O—H bonds, and $H_2O$ molecules contained in the film is less than $1\times10^{13}/cm^2$, etching does not progress.

When flowing the AHF gas, if the silicon substrate temperature is increased, the fluoride remaining on the surface of the substrate can be sublimated positively, thereby decreasing the amount of residual fluoride. Furthermore, since no water is introduced, corrosion in the chamber is little, realizing simple maintenance of the apparatus. Since the background water partial pressure can be decreased, the evacuation time can be shortened, thereby improving the throughput.

Since no water is supplied in this manner, generation of particles is suppressed, and selectivity with respect to the field oxide film and the like can be maintained. Furthermore, evacuation until the following step, e.g., the oxidation step, can be completed within a short period of time. Hence, the number of steps and process time can be decreased, thereby providing a method of manufacturing a semiconductor device having a high reliability and high operational speed.

According to the third aspect of the present invention, there is provided a semiconductor device manufacturing method comprising:

the step of removing an oxide formed on a surface of a silicide layer by using anhydrous hydrofluoric acid gas; and the step of removing, by heating, a fluoride formed on the silicide layer during removal of the oxide.

The step of removing the oxide may use a gas containing the anhydrous hydrofluoric acid gas and active fluorine radicals.

The step of removing the oxide is preferably performed while heating the silicide layer.

The step of removing the fluoride is preferably performed in either one of a vacuum atmosphere, an inert gas atmosphere, a hydrogen molecule gas atmosphere, a hydrogen plasma atmosphere, and a hydrogen atom gas atmosphere.

The step of removing the oxide includes the step of removing the oxide which is produced upon exposing the silicide layer to the solution containing active oxygen.

The step of removing the oxide and the step of removing the fluoride are performed continuously in a first process chamber, and the method preferably further comprises the step of transferring the silicide layer from which the oxide and the fluoride have been removed in the first process chamber to a second process chamber without being exposed to an outer atmosphere and through an atmosphere having a residual water partial pressure of not more than $1\times10^{-7}$ Torr, and the step of forming a conductive film on the silicide layer in the second process chamber.

When transferring the silicide layer in the first process chamber to the second process chamber, the interiors of the first and second process chambers are preferably at a pressure within a viscous flow range.

The present inventors studied a method of removing the oxide formed on a silicide layer, and found a novel fact as follows. More specifically, according to the study of the present inventors, when anhydrous hydrofluoric acid gas is particularly employed as the etching gas to remove the oxide formed on the silicide layer, the oxide can be sufficiently removed without etching the silicide layer.

Since this method does not use a high-energy ion, damage to the silicide layer is theoretically not caused, unlike in a method employing RIE. It was found that, although a fluoride is formed on the silicide layer during removal of the oxide, this fluoride has a low vapor pressure and thus can be removed easily by heating. Therefore, according to the present invention based on the above findings, the oxide on the surface of the silicide layer can be sufficiently removed without damaging the silicide layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and together with the general description given above and the detailed description of the preferred embodiments given below, serve to explain the principles of the invention.

FIG. 2 is a graph showing the relationship between the total concentration of Si—H bonds, Si—O—H bonds, and $H_2O$ molecules in a silicon oxide film and the etching rate of this oxide film;

FIGS. 3A to 3C are sectional views of a semiconductor device, showing in a stepwise manner a method of forming a contact electrode according to the second embodiment of the present invention;

FIGS. 5A and 5B are schematic sectional views showing the bonded state of hydrogen in oxide films, in which FIG. 5A shows the case of the dry oxide film and FIG. 5B shows the case of the wet oxide film;

FIGS. 9A to 9C are sectional views showing in a stepwise manner a method of forming a contact electrode according to the fifth embodiment of the present invention;

FIG. 10 is a graph showing the relationship between the partial pressure of anhydrous hydrofluoric acid gas and the etching rate of the chemical oxide film;

DETAILED DESCRIPTION OF THE PREFERRED EMBODIMENTS

The preferred embodiments of the present invention will be described in detail with reference to the accompanying drawings.

(First Embodiment)

FIGS. 1A to 1D are sectional views showing the steps of manufacturing a semiconductor device according to the first embodiment of the present invention.

Figure 1A:
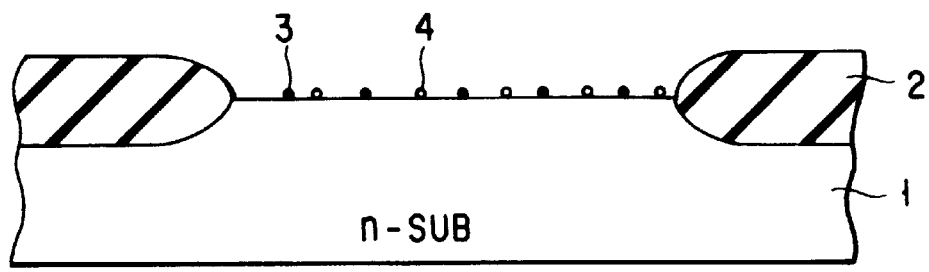
FIGS. 1A to 1D are sectional views showing in a stepwise manner a method of forming a tunnel oxide film according to the first embodiment of the present invention.
Figure 1B:
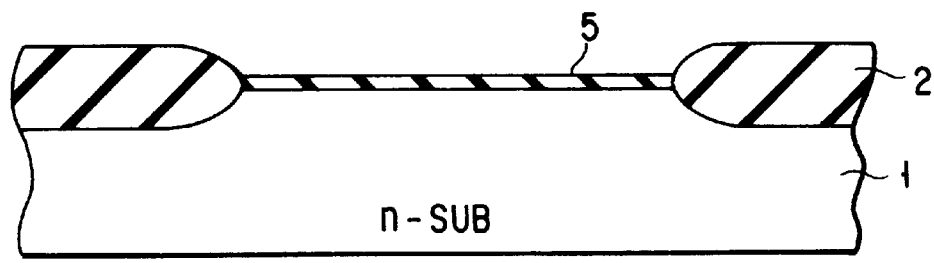

As shown in FIG. 1A, an 800-nm field oxide film 2 is formed by thermal oxidation on the surface of an n-type silicon substrate 1 having a (100) plane as a major surface. SH processing using $H_{2SO4}/H_2O_2$ is performed in order to remove organic matter 3 on the surface of the silicon substrate 1. By this SH processing, a chemical oxide film having a thickness of about 0.5 nm is formed on the surface of the silicon substrate 1. The chemical oxide film is removed by processing with dilute hydrofluoric acid.

SC2 processing using $HCl/H_2O_2/H_2O$ is performed in order to remove metal contamination 4 on the exposed surface of the silicon substrate 1. By this SC2 processing, the surface of the silicon substrate 1 is covered again with a chemical oxide film 5 containing Si—H bonds, Si—O—H bonds, and $H_2O$ molecules and having a thickness of about 0.5 nm.

Figure 1C:
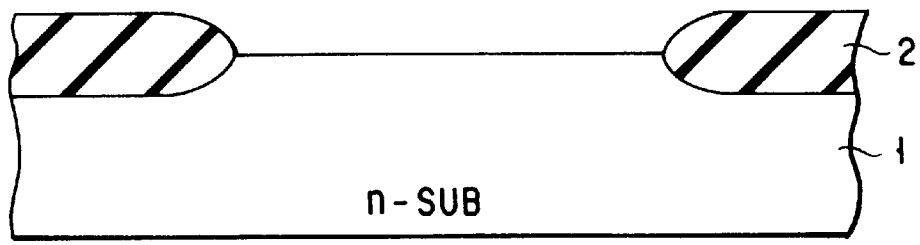
Figure 1D:
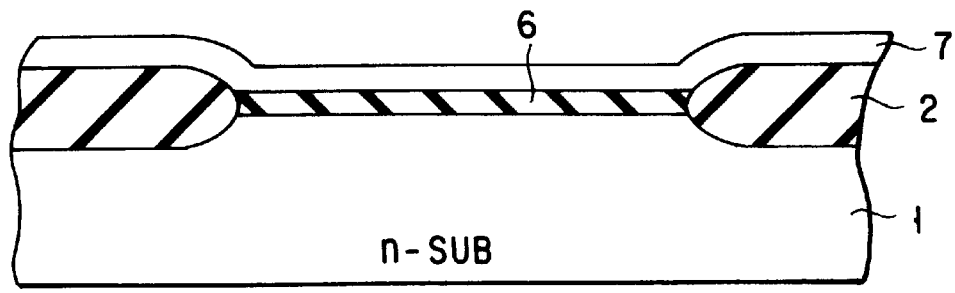

After these processing operations employing solutions, the silicon substrate 1 is transferred into a vacuum chamber. After the silicon substrate 1 is heated to 100° C. by infrared heating, AHF gas is supplied with a partial pressure of 4 Torr for 10 minutes while the substrate is maintained at this temperature. As a result, the chemical oxide film 5 having a thickness of about 0.5 nm is removed to expose a clean silicon surface (FIG. 1C). The thickness of the field oxide film 2 decreases by only about 0.1 nm, and no further decrease in thickness is confirmed even when the AHF gas is supplied for more than 10 minutes. If the pressure of the AHF gas is 4 Torr, the chemical oxide film 5 having a thickness of about 0.5 nm can be removed with processing of 1 minute; if 0.4 Torr, with processing of 30 minutes.

A tunnel oxide film 6 and a poly-Si layer 7 are formed continuously by incineration oxidation using $O_2$ and $H_2$, and by $SiH_4$ gas, respectively, in the same chamber (FIG. 1D), and the silicon substrate 1 is unloaded from the chamber. By this continuous processing, a stacked structure consisting of the poly-Si layer 7, the $SiO_2$ film 6, and the silicon substrate 1 can be formed without exposing the structure to the outer atmosphere, and the concentrations of impurities, e.g., organic matter, can be decreased in the respective interfaces of the stacked structure, thereby forming a highly reliable tunnel oxide film.

If the substrate temperature upon supply of the AHF gas is 500° C. or more, reoxidation of the silicon surface occurs after removal of the chemical oxide due to the water present in the background or water as the reaction product. This undesirably gives rise to formation of $SiO_x$ or entrapment of fluorine in the $SiO_x$. For this reason, as the range of the substrate temperature upon supply of the AHF gas, a range of 50° C. or more and less than 500° C., at which temperature reoxidation of the silicon surface does not occur, is effective. More preferably, a better result can be obtained with a substrate temperature range of 100° C. or more and less than 300° C.

This embodiment is effective not only for a reduced pressure process but also for a normal pressure process using AHF gas diluted with a carrier gas (e.g., argon). A good result is obtained when the partial pressure of the background water during processing is $1 \times 10^{-5}$ Torr or less. More preferably, better tunnel oxide film characteristics are obtained when the partial pressure of water is $1 \times 10^{-6}$ Torr or less.

In the above embodiment, the chemical oxide film can be selectively etched by controlling the concentration of Si—H bonds, Si—O—H bonds, or $H_2O$ molecules contained in the chemical oxide film and by using the AHF gas. For example, the number of Si—H bonds in the chemical oxide film formed by SC2 processing is about $0.3 \times 10^{14}/cm^2$ when measured by infrared absorption measurement, and the number of Si—H bonds in the chemical oxide film processed with hot nitric acid (60° C. $HNO_3$) is about $1.5 \times 10^{14}/cm^2$. Note that the number of Si—H bonds in a film, e.g., a thermal oxide film or a plasma CVD film, is less than $1 \times 10^{13}/cm^2$.

FIG. 2 is a graph showing the relationship between the total concentration of Si—H bonds, Si—O—H bonds, and $H_2O$ molecules in a silicon oxide film and the etching rate of this oxide film. As is apparent from FIG. 2, when the total concentration of Si—H bonds, Si—O—H bonds, and $H_2O$ molecules in the film is less than $1 \times 10^{13}/cm^2$, as in the thermal oxide film or a plasma CVD film, etching by AHF gas substantially does not progress. In contrast to this, when the total concentration is $1 \times 10^{13}/cm^2$ or more, as in the chemical oxide film described above, etching by AHF gas is conspicuous.

An example of a film containing a large amount of Si—H bonds, Si—O—H bonds, and $H_2O$ molecules includes a BPSG (boron-doped phospho-silicate glass) film obtained by the solution treatment which will be described later, a chemical oxide film obtained by processing with hot nitric acid or hot nitric acid/ammonia, and the-like. An example of a film in which the total concentration of Si—H bonds, Si—O—H bonds, and $H_2O$ molecules is $1 \times 10^{13}/cm^2$ or slightly larger than this includes, e.g., a chemical oxide film obtained by processing with ozone water or ammonia water.

The concentration of Si—H bonds, Si—O—H bonds, and $H_2O$ molecules differs depending on the type and crystallinity of the underlying layer. For example, in a chemical oxide film formed on Si surfaces (100) and (111) by SC2 processing, the concentration of Si—H bonds and Si—O—H bonds is larger on the Si surface (100) than on the Si surface (111). When a chemical oxide film formed on a Si (100) surface and a chemical oxide film formed on $TiSi_2$ by SH processing are compared, the total concentration of Si—H bonds, Si—O—H bonds and $H_2O$ molecules is larger on $TiSi_2$ than on the Si surface (100). It is also possible to change the concentration of Si—H bonds, Si—O—H bonds, and $H_2O$ molecules in the film by changing the formation time of the chemical oxide film or the water flowing time after the formation.

In the above embodiment, the above concentration can be controlled by adjusting, e.g., the process time of SC2 processing ($HCl/H_2O_2/H_2O$) to 10 to 30 minutes. In this case, when the process time is increased, the concentrations increase.

The above concentration can be controlled also by performing SC2 processing ($HCl/H_2O_2/H_2O$) and thereafter exposing the chemical oxide film to ultra-pure water having an oxygen concentration of 10 ppb or less while adjusting the water flow time of the ultra-pure water to 10 to 30 minutes. In this case, when the water flow time is increased, the concentration increases.

As described above, when the oxide film is to be selectively left by using AHF gas, or when the oxide film is to be removed, the selectivity can be controlled by changing the type of chemical oxide film, the type of underground layer, the formation time of the chemical oxide film, or the water flow time.

In the above embodiment, continuous processing is performed in the same chamber. However, the present invention is not limited to this. A plurality of processing steps can be performed by using a plurality of different chambers connected to each other through a transfer chamber, without exposing the substrate to the outer atmosphere, thereby providing the same effect.

The present invention is used not only for the pre-processing step of formation of a tunnel oxide film, but also for the pre-processing step of formation of a gate oxide film. Furthermore, the silicon region can be a region made of monocrystalline silicon, polycrystalline silicon, or monocrystalline or polycrystalline silicon containing, e.g., about 20% of germanium at maximum.

In the above embodiment, after SC2 processing ($HCl/H_2O_2/H_2O$) is performed, the chemical oxide film formed by this processing is removed by AHF processing. However, SH processing ($H_2SO_4/H_2O_2$),may be performed, and thereafter a chemical oxide film formed by this processing may be removed by AHF processing.

(Second Embodiment)

A semiconductor device manufacturing process according to the second embodiment of the present invention will be described with reference to FIGS. 3A to 3C.

According to the method of this embodiment, in formation of a contact hole in an insulating film different from an oxide film, e.g., the chemical oxide film described above, only the native oxide film on the bottom portion of the contact hole is selectively etched while suppressing etching of this insulating film.

An 800-nm thick field oxide film 32 and a 10-nm thick gate oxide film 34 are continuously formed by thermal oxidation on an n-type silicon substrate 31 having a (100) plane as a major surface. $BF_2^+$ ions are implanted in an element formation region surrounded by the field oxide film 32 with an acceleration voltage of 35 eV and a dose of $5 \times 10^{15}$ cm$^{-2}$. The n-type silicon substrate 31 is then heated to 1,000 w for 20 seconds in an $N_2$ atmosphere, thereby forming a shallow p$^+$-type diffusion layer 33 having a thickness of about 0.1 μm. Subsequently, a stacked layer consisting of a CVD-SiO$_2$ film 35 and a BPSG film 36 is deposited as an insulating interlayer film on the entire surface to a thickness of 1.0 μm, and a contact hole is formed on the diffusion layer 33 (FIG. 3A). At this time, the resultant structure is left in the outer atmosphere to form a native oxide film 37 on the surface of the diffusion layer 33.

Subsequently, the silicon substrate 31 is transferred into a vacuum chamber in order to remove the native oxide film 37 on the diffusion layer. After the substrate 31 is heated to 100° C. by infrared heating, AHF gas is supplied to the chamber at a pressure of 4 Torr for 10 minutes while the substrate is maintained at this temperature. As the native oxide film 37 formed by water and oxygen in the atmosphere contains a large amount of Si—O—H bonds, it is removed selectively to expose a clean surface of the diffusion layer 33 (FIG. 3B).

In this case, the thicknesses of the gate oxide film 34, the CVD-SiO$_2$ film 35, and the BPSG film 36 decrease by only about 0.1 to 0.5 nm, and a decrease in diameter of the bottom portion of the contact hole caused by set back of the gate oxide film 34 is not observed. The concentration of Si—H bonds, Si—O—H bonds, and H$_2$O molecules in the films is higher in the order of the gate oxide film 34, the CVD-SiO$_2$ film 35, and the BPSG film 36, and so is the etching rate of etching caused by the AHF gas. Thus, by performing processing using the AHF gas, a tapered shape of the contact hole can be realized, and also the shoulder of the contact hole is rounded.

Furthermore, a Ti layer 38 (with a thickness of 30 nm) and a TiN layer 39 (with a thickness of 70 nm) are formed on the surface of the substrate 31 by continuous sputtering. Thereafter, a TiSi$_2$ layer 40 is formed on the surface of the substrate 31 at the bottom portion of the contact hole by RTA (Rapid Thermal Anneal) processing at 750 w for 30 seconds, and a blanket-shaped W layer 41 is formed on the entire surface of the resultant structure (FIG. 3C).

By this AHF processing, the native oxide film on the bottom portion of the contact hole can be removed selectively, thereby preventing an increase in contact resistance. The amount of etching of the insulating interlayer film where the contact hole is formed can be decreased, thereby preventing variations in contact resistance. Furthermore, since the opening portion of the contact hole is rounded and the contact can be formed in a tapered manner, the coverage of the Ti film/TiN film on the side wall of the contact is improved in continuous sputtering of the Ti film/TiN film, so that the W layer 41 has a good buried shape. As a result, a method of manufacturing a high-reliability, high-operational-speed semiconductor device having good contact characteristics can be provided.

In the above embodiment, as the oxide film which is removed by the AHF gas, a native oxide film formed by water and oxygen in the outer atmosphere is used. However, a chemical oxide film which is intentionally formed by SH processing and SC2 processing may be used, in the same manner as in the first embodiment.

In the study of this embodiment, to analyze a trace amount of hydrogen and water contained in the surfaces of various oxide films or in oxide films, TDS (Thermal Desorption Spectroscopy) analysis having a high detection sensitivity is used. According to this analysis, a silicon substrate is heated in a high vacuum of about $1 \times 10^{-9}$ Torr within a temperature range of room temperature to 700° C. at a heating rate of 60° C./minute, and the amounts of hydrogen and water dissociated from the substrate are measured by a double-focused mass spectrometer. Thus, the amounts hydrogen and water contained in the oxide film can be obtained. The bonded state of hydrogen or water in the surfaces of the oxide films or in the oxide films can be obtained from the temperature at which the hydrogen or water dissociates from the substrate.

Figure 4:
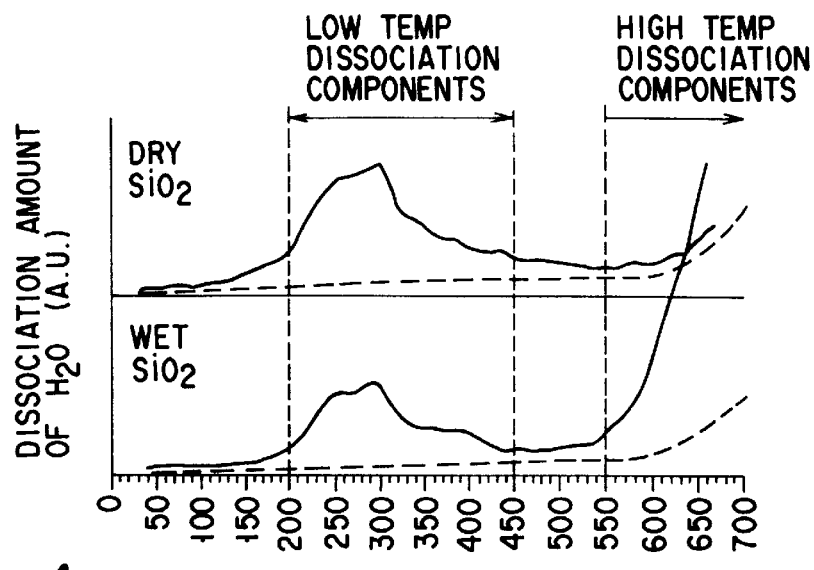
FIG. 4 is a graph showing the relationship between the heating temperature and the dissociation amount of water content of each of a dry oxide film and a wet oxide film.

As an example, FIG. 4 shows the result of TDS analysis of a 0.5-$\mu$m thick dry oxide film (an oxide film oxidized by dry oxygen) and a 1.2-$\mu$m thick wet oxide film (an oxide film oxidized by water vapor). The axis of ordinate represents the dissociation amount of water, and the axis of abscissa represents the substrate temperature. In a temperature range of 200 to 450° C., low temperature dissociation components exist in both the oxide films. In the wet oxide film, high temperature dissociation components exist in a temperature range of 550° C. or more. Broken curves indicate the dissociation amounts of water contained in the background.

Figures 5A, 5B:
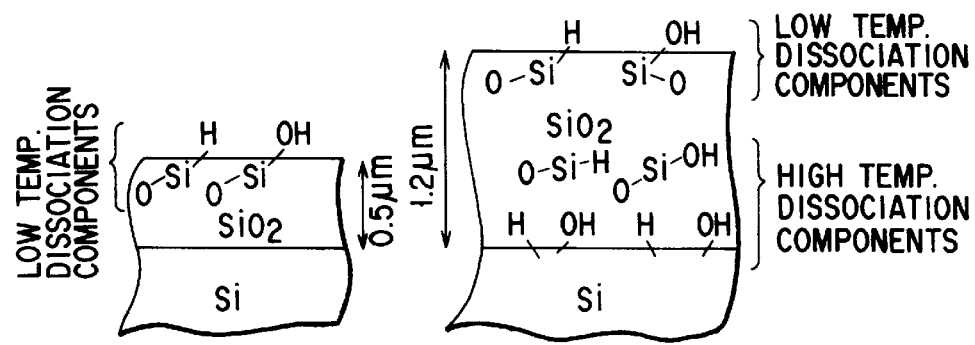

FIGS. 5A and 5B are schematic sectional views showing the bonded state of Si, O, H, and OH in the 0.5-$\mu$m thick dry oxide film and in the 1.2-$\mu$m thick wet oxide film, respectively. As shown in FIGS. 5A and 5B, the low temperature dissociation components originate from Si—OH bonds adsorbed in the surface of the oxide film, and the high temperature dissociation components originate from Si—OH bonds present in the oxide film. The amounts of high and low temperature dissociation components can be obtained by integrating the areas surrounded by the curves and the reference lines in FIG. 4.

Figure 6:
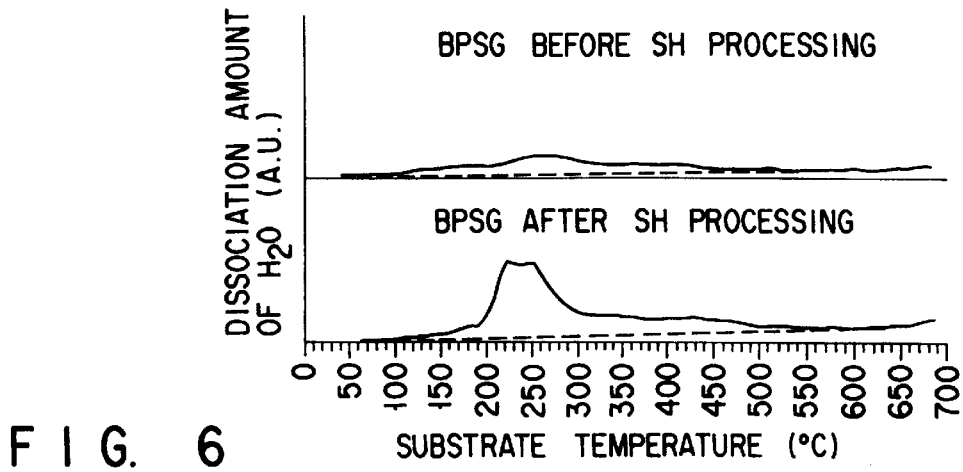
FIG. 6 is a graph showing a change in dissociation amount of water content of the BPSG film before and after SH processing.

A change in TDS spectrum, before and after SH processing, of the BPSG film used in the second embodiment was examined. FIG. 6 shows the spectrum of dissociation amount of water. From FIG. 6, it is apparent that the low temperature dissociation components are larger in amount after SH processing than before. This suggests that the surface of the BPSG film terminates with Si—OH bonds upon SH processing. The Si—OH concentration is estimated to be about $5 \times 10^{13}$ cm$^{-2}$ or more, and only the surface of the BPSG film is etched by the AHF gas. In the second embodiment, the BPSG film in the contact region has a rounded shape due to the above reason.

Si—OH bonds can be formed on the surface of the BPSG film not only by SH processing but also by solution processing in general, e.g., SC2 processing, or by leaving the structure in the outer atmosphere, e.g., an atmosphere of relative humidity more than 20%. The concentration of Si—OH bonds increases in proportion to the solution process time and atmosphere exposing time.

(Third Embodiment)

A semiconductor device manufacturing process according to the third embodiment of the present invention will be described with reference to FIGS. 7A to 7D.

According to the method of this embodiment, in formation of a contact hole in an insulating film different from an oxide film, e.g., the chemical oxide film described above, the surface of the silicon substrate on the bottom portion of the contact is cleaned without etching the insulating film.

Figure 7A:
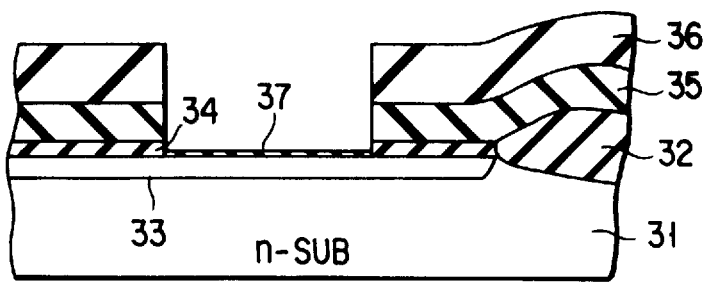
FIGS. 7A to 7D are sectional views showing in a stepwise manner a method of forming a contact electrode according to the third embodiment of the present invention.

An 800-nm thick field oxide film 32 and a 10-nm thick gate oxide film 34 are continuously formed by thermal oxidation on an n-type silicon substrate 31 having a (100) plane as a major surface. BF$_2^+$ ions are implanted in an element formation region surrounded by the field oxide film 32 with an acceleration voltage of 35 eV to a dose of $5 \times 10^{15}$ cm$^{-2}$. The n-type silicon substrate 31 is then heated to 1,000° C. for 20 seconds in an N$_2$ atmosphere, thereby forming a shallow p$^+$-type diffusion layer 33 having a thickness of about 0.1 $\mu$m. Subsequently, a stacked layer consisting of a CVD-SiO$_2$ film 35 and a BPSG film 36 is deposited as an insulating interlayer film on the entire surface to a thickness of 1.0 $\mu$m, and a contact hole is formed on the diffusion layer 33 (FIG. 7A). A native oxide film 37 absorbing water is formed on the surface of the diffusion layer 33. The native oxide film absorbing water is so treated that the total concentration of Si—H bonds, Si—O—H bonds, and H$_2$O molecules contained therein is not less than $1 \times 10^{13}$/cm$^2$. For example, this is attained by leaving the surface of the diffusion layer 33 is an atmosphere of relative moisture more than 5% for more than one hour.

Figure 7B:
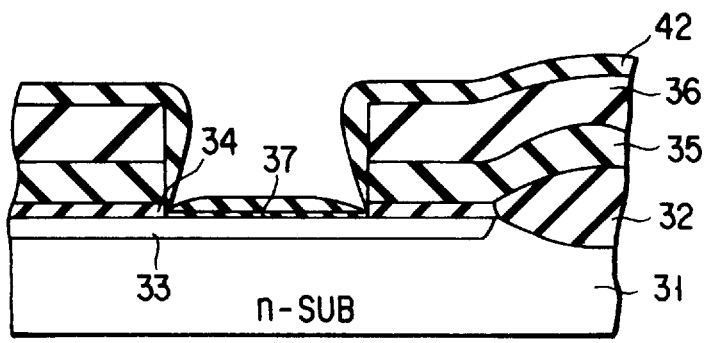

A fluorine-doped silicon oxide film 42 is formed on the entire surface of the contact hole by plasma CVD (FIG. 7B). Anyone of O$_2$, O$_3$, SiH$_4$, Si$_2$H$_6$, CF$_4$, NF$_3$ and the like may be used as a material gas. At this time, a portion of the fluorine-doped silicon oxide film 42 formed on the bottom portion of the contact hole is thinner than its portions formed on the surface of the BPSG film 36 and on the side surface of the contact hole. After the fluorine-doped silicon oxide film 42 is formed, the resultant structure is left in the outer atmosphere, thereby trapping water in the film 42.

Figure 7C:
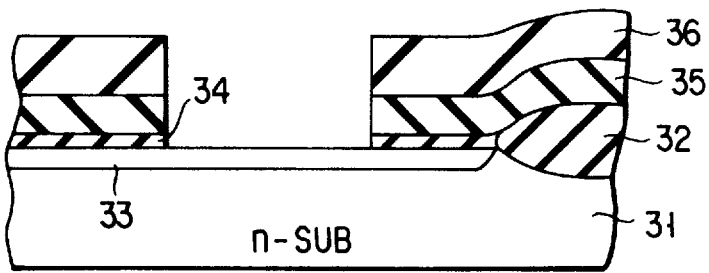

Subsequently, the silicon substrate 31 is transferred into a vacuum chamber in order to remove the native oxide film 37 on the diffusion layer and the 2C, fluorine-doped silicon oxide film 42. After the substrate 31 is heated to 100° C. by infrared heating, AHF gas is supplied to the chamber at a pressure of 4 Torr for 10 minutes while the substrate is maintained at this temperature. As the native oxide film 37 formed as above-mentioned and the fluorine-doped silicon oxide film 42 that has absorbed water as it is left in the atmosphere contain a large amount of Si—O—H bonds and the like, they are removed selectively to expose a clean surface of the diffusion layer 33 (FIG. 7C).

In this case, as the gate oxide film 34, the CVD-SiO$_2$ film 35, and the BPSG film 36 are covered with the fluorine-doped silicon oxide film 42 left thereon, their thicknesses do not decrease, and an increase in diameter of the contact hole is not observed. The above-mentioned fluorine-doped silicon oxide film 42 is removed by AHF gas, and the upper edge portion of the contact hole formed in the BPSG film 36 is rounded at the same time.

Figure 7D:
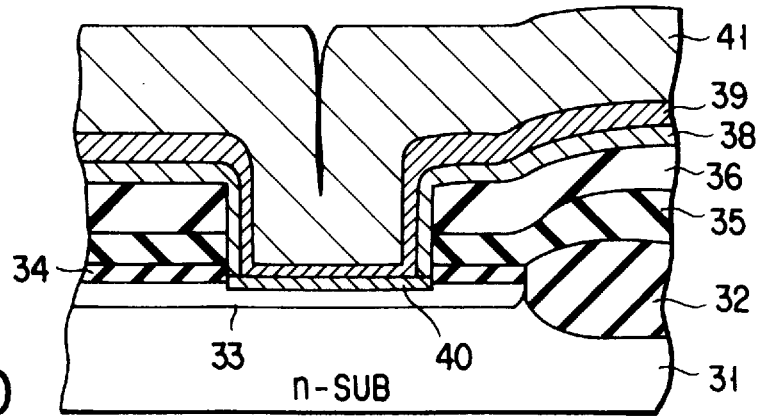

Furthermore, a stacked layer consisting of a Ti layer 38 (with a thickness of 30 nm) and a TiN layer 39 (with a thickness of 70 nm) is formed on the surface of the substrate 31 by continuous sputtering. Thereafter, a TiSi$_2$ layer 40 is formed by RTA processing at 750° C. for 30 seconds, and a blanket-shaped W layer 41 is formed on the entire surface of the resultant structure (FIG. 7D).

By this AHF processing, only the bottom portion of the contact can be cleaned, and the insulating film forming the contact is not etched. Thus, an increase in contact hole diameter can be prevented, thereby preventing variations and increase in contact resistance. As a result, the W layer 41 can have a good buried shape, thereby providing a high-operational-speed, high-reliability semiconductor device having good contact characteristics.

In the above embodiment, as the oxide film which is removed by the AHF gas, a native oxide film formed by water and oxygen in the outer atmosphere is employed. However, a chemical oxide film which is intentionally formed by SH processing of SC2 processing may be employed, in the same manner as in the first embodiment.

(Fourth Embodiment)

A semiconductor device manufacturing method according to the fourth embodiment of the present invention will be described with reference to FIGS. 8A to 8E. According to the method of this embodiment, in formation of a contact hole in an insulating film different from an oxide film, e.g., the chemical oxide film described above, the contact is formed into a tapered shape by controlling etching of the insulating film, and the silicon surface of the bottom portion of the contact is cleaned.

Figure 8A:
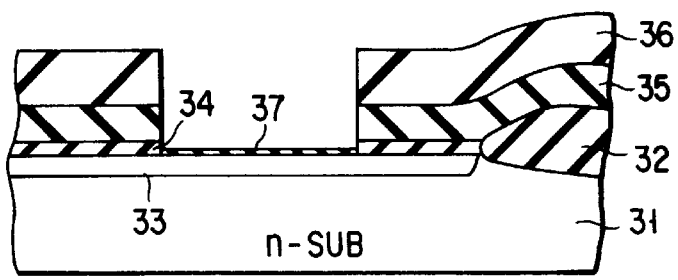
FIGS. 8A to 8E are sectional views showing in a stepwise manner a method of forming a contact electrode according to the fourth embodiment of the present invention.

A field oxide film 32 and a gate oxide film 34 are continuously formed by thermal oxidation on an n-type silicon substrate 31 having a (100) plane as a major surface. BF$_2^+$ ions are implanted in an element formation region surrounded by the field oxide film 32, and the n-type silicon substrate 31 is heated in an N$_2$ atmosphere, thereby forming a shallow diffusion layer 33. Subsequently, a stacked layer consisting of a CVD-SiO$_2$ film 35 and a BPSG film 36 is deposited as an insulating interlayer film on the entire surface, and a contact hole is formed on the diffusion layer 33 (FIG. 8A). A native oxide film 37 absorbing water is formed on the diffusion layer 33 in the same manner as in the third embodiment.

Figure 8B:
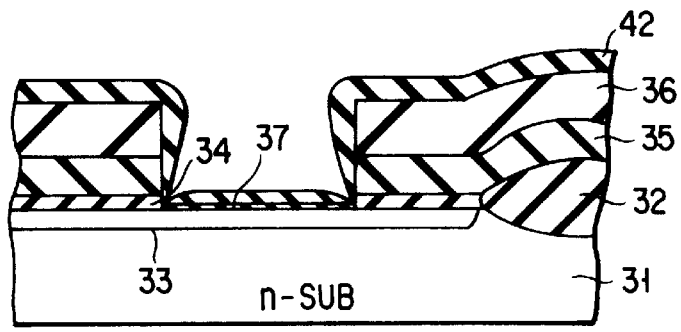

A fluorine-doped silicon oxide film 42 is formed on the entire surface of the contact hole by plasma CVD (FIG. 8B). At this time, a portion of the fluorine-doped silicon oxide film 42 formed near the bottom portion of the contact hole is thinner than its portions formed on the surface of the BPSG film 36 and on the side surface of the contact hole. After the fluorine-doped silicon oxide film 42 is formed, the resultant structure is immersed in pure water, thereby trapping excessive water in the film 42.

Figure 8C:
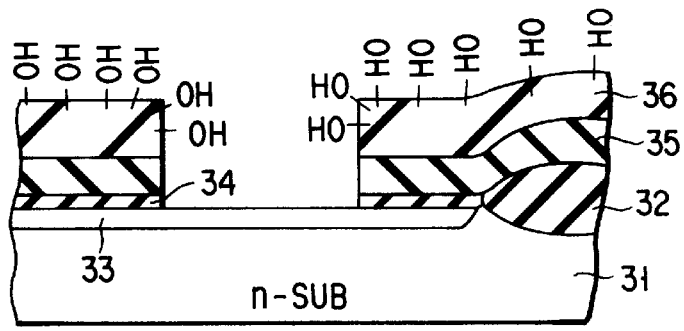
Figure 8D:
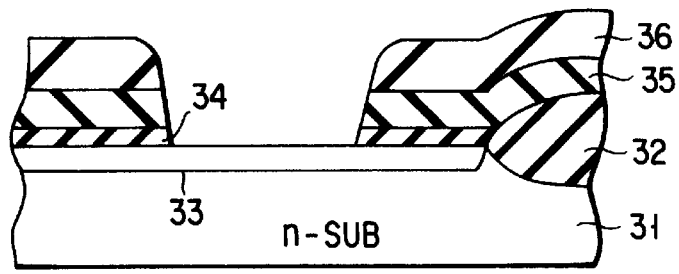

Subsequently, the silicon substrate 31 is transferred into a vacuum chamber in order to remove the native oxide film 37 on the diffusion layer and the fluorine-doped silicon oxide film 42. After the substrate 31 is heated to 100° C. by infrared heating, AHF gas is supplied to the chamber at a pressure of 4 Torr for 10 minutes while the substrate is maintained at this temperature. As the native oxide film 37 formed as aforementioned and the fluorine-doped silicon oxide film 42 that has absorbed excessive water upon being immersed in the pure water contain a large amount of Si—O—H bonds and the like, they are removed selectively to expose a clean surface of the diffusion layer 33 (FIG. 8C). Since excessive water has been supplied to the fluorine-doped silicon oxide film 42, water that did not react with the AFH gas remains on the surface of the BPSG film 36 in the form of Si—O—H bonds. In this state, the etching thickness of the BPSG film 36 is controlled by adjusting the AHF gas process time, thereby forming a contact hole having a rounded upper edge at the opening (FIG. 8D).

In this case, even if water is supplied to the surfaces of the gate oxide film 34 and CVD-SiO$_2$ film 35, since the films 34 and 35 are dense oxide films having strong Si—O bonds, Si—OH bonds are hard to form in these films. Hence, the thicknesses of the oxide films other than the BPSG film 36 do not decrease, and an increase in diameter of the bottom portion of the contact hole is not observed.

Figure 8E:
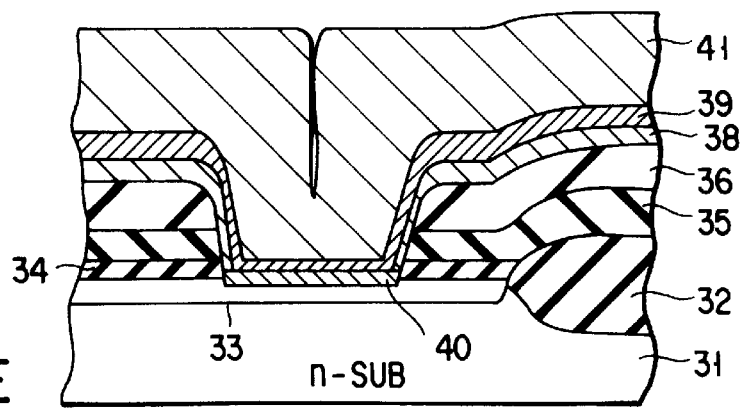

A Ti layer 38 (with a thickness of 30 nm) and a TiN layer 39 (with a thickness of 70 nm) are continuously formed on the entire surface of the substrate 31 by sputtering. Thereafter, a TiSi$_2$ layer 40 is formed by RTA (Rapid Thermal Anneal) processing at 750° C. for 30 seconds, and a blanket-shaped W layer 41 is formed (FIG. 8E).

By this AHF processing, cleaning of the bottom portion of the contact and tapering formation of the contact hole can be controlled independently of each other, and the taper angle can also be adjusted. A contact hole having an optimum taper angle can be formed by adjusting the conditions of continuous sputtering of the Ti film/TiN film, so that the W layer has a good buried shape. As a result, variations and increase in contact resistance can be prevented, thereby providing a method of manufacturing a high-operational-speed, high-reliability semiconductor device.

In the above embodiment, as the oxide film which is removed by the AHF gas, a native oxide film formed by water and oxygen in the atmosphere is employed. However, a chemical oxide film which is intentionally formed by SH processing or SC2 processing may be employed, in the same manner as in the first embodiment.

As described above, according to the semiconductor device manufacturing method of the present invention, the AHF gas is used in pre-processing for formation of an oxide film, e.g., a tunnel oxide film, or for formation of the contact, so that the insulating film, e.g., the chemical oxide film, on the surface of the silicon region can be selectively removed from a thermal oxide film (a field oxide film, a gate oxide film, and the like) or an insulating film, e.g., a CVD oxide film, in which a contact has been formed. As a process in which water is not externally supplied is possible, particle generation on the surface of the substrate can be suppressed, thereby easily decreasing the partial pressure of the background water. Accordingly, a high-reliability semiconductor device can be manufactured with a high throughput by decreasing the number of steps or process time.

Removal of the chemical oxide film by means of the AHF gas is also effective for removal of a $SiO_2$ film formed on the contact electrode using a silicide. A method exemplifying this will be described.

(Fifth Embodiment)

FIGS. 9A to 9C are sectional views of a semiconductor device showing in a stepwise manner a semiconductor device manufacturing method according to the fifth embodiment of the present invention. More specifically, FIGS. 9A to 9C show a method of selectively forming a W layer in a contact hole.

As shown in FIG. 9A, the surface of an n-type silicon substrate 101 having a (100) plane as a major surface is thermally oxidized to form a field oxide film 102. Subsequently, $BF_2^+$ ions are implanted in an element formation region surrounded by the field oxide film 102, and the n-type silicon substrate 101 is heated in an $N_2$ atmosphere, thereby forming a shallow $p^+$-type diffusion layer 103 having a thickness of about 0.1 km on the surface of the element formation region.

Subsequently, a stacked layer consisting of a CVD-$SiO_2$ film 104 and a BPSG film 105 is deposited as an insulating interlayer film on the entire surface to a thickness of 1.0 μm and is etched, thereby forming a contact hole on the $p^+$-type diffusion layer 103. Thereafter, the n-type silicon substrate 101 is washed with a dilute hydrofluoric acid aqueous solution to separate the native oxide film on the surface of the $p^+$-type diffusion layer 103.

A Ti film having a thickness of about 30 nm and a TiN film having a thickness of about 70 nm are continuously formed by sputtering, and silicidation with RTA processing is performed at 1,000° C. for 20 seconds. Thereafter, the stacked film consisting of the Ti film and the TiN film is removed by SH processing (10 minutes) using sulfuric acid and hydrogen peroxide. As a result, a $TiSi_2$ layer 106 having a thickness of about 60 nm is formed on the $p^+$-type diffusion layer 103, and a $SiO_x$ layer 107 having a thickness of about 4 nm is further formed on the $TiSi_2$ layer 106.

As shown in FIG. 9B, anhydrous hydrofluoric acid gas is supplied onto the $TiSi_2$ layer 106 at 1 Torr and room temperature for 10 minutes to selectively remove the SiOx layer 107. At this time, the exposed surface of the $TiSi_2$ layer 106 is fluoridized, and a $TiF_x$ layer 108 having a low vapor pressure is formed on the fluoridized surface of the $TiSi_2$ layer 106.

If the pressure of the anhydrous hydrofluoric acid gas is 4 Torr, the $SiO_x$ layer 107 having a thickness of 4 nm is removed with processing of 1 minute; if 0.4 Torr, with processing of 30 minutes.

In this embodiment, not a high-energy ion but the anhydrous hydrofluoric acid gas is used as the etchant. Thus, the $TiSi_2$ layer 106 is not damaged.

As shown in FIG. 9C, the remaining $TiF_x$ layer 108 is removed by annealing in a hydrogen atmosphere. This is because if a W layer is formed in the contact hole with the $TiF_x$ layer 108 being left, the contact resistance increases.

More specifically, in the above annealing, heating is performed for 10 minutes with a hydrogen partial pressure of 0.035 Torr while the temperature of the $TiSi_2$ layer 106 (the $TiSi_2$ temperature) is kept at 250° C. By this annealing, the $TiF_x$ layer 108 on the $TiSi_2$ layer 106 is removed completely to expose a clean surface of the $TiSi_2$ layer 106. This annealing uses hydrogen in order to prevent reduction of the $TiFx_x$ layer 108 and reoxidation of the surface of the $TiSi_2$ layer 106 by oxygen, water, and the like present in the background.

The hydrogen partial pressure of the above annealing is preferably 0.01 Torr or more. The $TiSi_2$ layer 106 having a clean surface was obtained with the $TiSi_2$ temperature falling within the range of 100° C. to 500° C.

In this embodiment, the pressure of the anhydrous hydrofluoric acid gas was 1 Torr, and the gas supply time was 10 minutes. It was found out that if the pressure of the anhydrous hydrofluoric acid gas was 0.4 Torr, the supply time is set longer than 30 minutes, if 1 Torr, the supply time is set longer than 10 minutes, and if 4 Torr, the supply time is set longer than 1 minute. Then, a thick $TiF_x$ layer 108 can be formed on the $TiSi_2$ layer 106 with the isotopic abundance of TiF3 being higher than that of $TiF_2$. More specifically, it was found out that under the above conditions, even if annealing was performed in the same hydrogen atmosphere, the $TiF_x$ layer 108 was not removed.

Finally, as shown in FIG. 9C, while the $TiSi_2$ temperature is maintained at 350° C., monosilane ($SiH_4$) gas and tungsten hexafluoride ($WF_6$) gas (with a total pressure of 0.15 Torr) are supplied onto the contact hole for 60 seconds both at a flow rate of 10 sccm, thereby selectively forming a W layer 109 on the $TiSi_2$ layer 106. In this manner, a contact electrode consisting of the $TiSi_2$ layer 106 and the W layer 109 is completed. As no $SiO_x$ layer 107 remains on the $TiSi_2$ layer 106, the W layer 109 does not easily separate.

Furthermore, since the $TiSi_2$ layer 106 is not damaged during removal of the $SiO_x$ layer 107, the contact resistance across the $TiSi_2$ layer 106 and the W layer 109 becomes sufficiently low. Accordingly, the contact resistance across the contact electrode and the $p^+$-type diffusion layer 103 also becomes sufficiently low.

FIG. 10 shows the relationship between the partial pressure of the anhydrous hydrofluoric acid gas and the etching rate of the $SiO_x$ layer. This shows a case wherein the substrate is set at room temperature. In order to suppress overetching of the $TiSi_2$ layer 106 as much as possible during removal of the $SiO_x$ layer 107, it is important that the etching rate with respect to the partial pressure of the anhydrous hydrofluoric acid gas to be employed be calculated from FIG. 6 and that the etching time be determined from this etching rate.

It was found out that when the silicide layer is the $TiSi_2$ layer 106, as in this embodiment, the residual fluoride that can be removed the easiest is $TiF_2$. This may be because $TiF_2$ has a higher vapor pressure than $TiF_x$ (x=1, 3, 4). If the $TiSi_2$ layer is exposed to the anhydrous hydrofluoric acid gas for a long period of time, fluoridization of titanium progresses. Then, the proportion of $TiF_3$ increases to make it difficult to remove the fluoride even when hydrogen gas processing is performed. Therefore, when the time for which the $TiSi_2$ layer is exposed to the anhydrous hydrofluoric acid gas is selected appropriately so that the residual fluoride on the surface of the $TiSi_2$ layer is $TiF_2$, removal by hydrogen gas processing can be performed effectively.

(Sixth Embodiment)

Figure 11A:
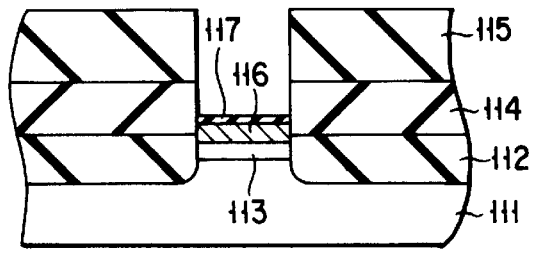
FIGS. 11A to 11C are sectional views showing in a stepwise manner a method of forming a contact electrode according to the sixth embodiment of the present invention.
Figure 11B:
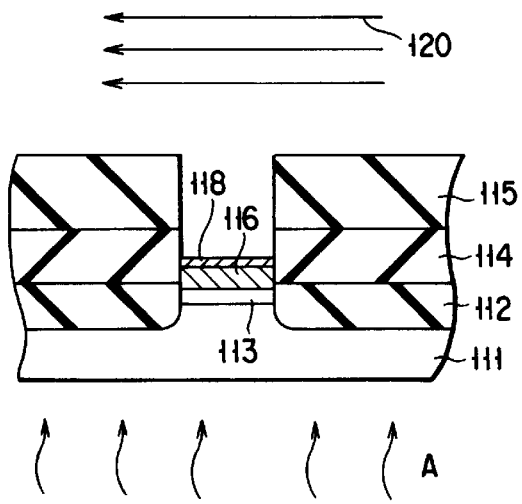
Figure 11C:
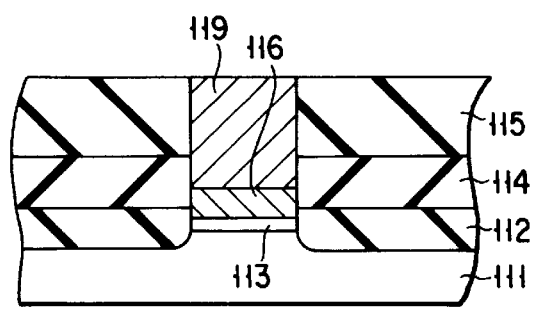

FIGS. 11A to 11C are sectional views of a semiconductor device showing in a stepwise manner a method of forming a contact electrode according to the sixth embodiment of the present invention.

As shown in FIG. 11A, the surface of an n-type silicon substrate 111 having a (100) plane as a major surface is thermally oxidized to form a field oxide film 112. Subsequently, $BF_2^+$ ions are implanted in an element formation region surrounded by the field oxide film 112, and the n-type silicon substrate 111 is heated in an $N_2$ atmosphere, thereby forming a shallow $p^+$-type diffusion layer 113 on the surface of the element formation region.

Subsequently, a stacked layer consisting of a CVD-SiO$_2$ film 114 and a BPSG film 115 is deposited as an insulating interlayer film on the entire surface and is etched, thereby forming a contact hole on the p$^+$-type diffusion layer 113. Thereafter, the n-type silicon substrate 111 is washed with a dilute aqueous hydrofluoric acid solution to separate the native oxide film on the surface of the p$^+$-type diffusion layer 113.

A Ti film and a TiN film are continuously formed by sputtering, and silicidation with RTA processing is performed. Thereafter, the Ti film and the TiN film are removed by SH processing. As a result, a TiSi$_2$ layer 116 is formed on the p$^+$-type diffusion layer 113, and a SiO$_x$ layer 117 is further formed on the TiSi$_2$ layer 116.

As shown in FIG. 11B, infrared rays A are irradiated from the lower surface side of the n-type silicon substrate 111 to heat the TiSi$_2$ layer 116 to 100° C., and anhydrous hydrofluoric acid gas 120 is supplied onto the TiSi$_2$ layer 116 at 1 Torr and room temperature for 10 minutes, thereby removing the SiO$_x$ layer 117.

At this time, the TiSi$_2$ layer 116 is not damaged, in the same manner as in the fifth embodiment. Furthermore, the exposed surface of the TiSi$_2$ layer 116 is fluoridized, in the same manner as in the fifth embodiment, and a TiF$_x$ layer 118 having a low vapor pressure is formed on the fluoridized surface of the TiSi$_2$ layer 116. In this embodiment, the TiF$_x$ layer 118 is sublimated positively by the infrared rays A, so the residual fluorine concentration becomes sufficiently low.

Finally, as shown in FIG. 1C, the residual TiF$_x$ layer 118 is removed by annealing in the hydrogen atmosphere to expose a clean surface of the TiSi$_2$ layer 116. Thereafter, after the TiSi$_2$ layer 116 is heated to 350° C., SiH$_4$ and WF$_6$ are supplied onto the contact hole while the TiSi$_2$ layer is maintained at this temperature, thereby selectively forming a W layer 119 on the TiSi$_2$ layer 116.

If the temperature of the TiSi$_2$ layer 116 upon supply of the anhydrous hydrofluoric acid gas exceeds 500° C., the surface of the TiSi$_2$ layer 116 from which the native oxide layer has been removed reoxidizes in the presence of water in the background or water as the reaction product, so that TiO$_x$ and SiO$_x$ form undesirably. For this reason, it is effective to set the temperature range of the TiSi$_2$ layer 116 upon supply of the anhydrous hydrofluoric acid gas to be 50 to 500° C. More preferably, a better result is obtained with a temperature range of 100 to 300° C.

(Seventh Embodiment)

Figure 12A:
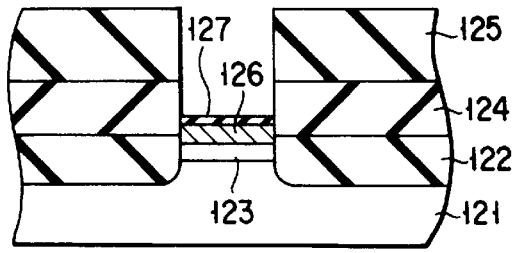
FIGS. 12A to 12C are sectional views showing in a stepwise manner a method of forming a contact electrode according to the seventh embodiment of the present invention.
Figure 12B:
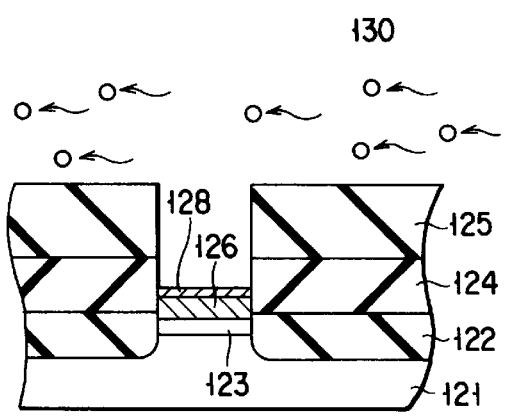
Figure 12C:
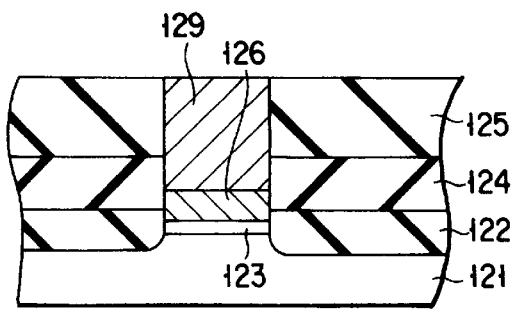

FIGS. 12A to 12C are sectional views of a semiconductor device showing in a stepwise manner a method of forming a contact electrode according to the seventh embodiment of the present invention.

As shown in FIG. 12A, the surface of an n-type silicon substrate 121 is thermally oxidized to form a field oxide film 122. Subsequently, BF$_2$$^+$ ions are implanted in an element formation region surrounded by the field oxide film 122, and the n-type silicon substrate 121 is heated in an N$_2$ atmosphere, thereby forming a shallow p$^+$-type diffusion layer 123 on the surface of the element formation region.

Subsequently, a stacked layer consisting of a CVD-SiO$_2$ film 124 and a BPSG film 125 is deposited as an insulating interlayer film on the entire surface and is etched, thereby forming a contact hole on the p$^+$-type diffusion layer 123. Thereafter, the n-type silicon substrate 121 is washed with a dilute aqueous hydrofluoric acid solution to separate the native oxide film on the surface of the p$^+$-type diffusion layer 123.

A Ti film and a TiN film are continuously formed by sputtering, and silicidation with RTA processing is performed. Thereafter, the Ti film and the TiN film are removed by SH processing. As a result, a TiSi$_2$ layer 126 is formed on the p$^+$-type diffusion layer 123, and a SiO$_x$ layer 127 is further formed on the TiSi$_2$ layer 126.

As shown in FIG. 12B, the SiO$_x$ layer 127 is removed by a large amount of active fluorine radicals 130 that are formed by anhydrous hydrofluoric acid down flow plasma processing using microwave discharge (2,450 MHz). At this time, the exposed surface of the TiSi$_2$ layer 126 is fluoridized, and a TiF$_x$ layer 128 having a low vapor pressure is formed on the fluoridized surface of the TiSi$_2$ layer 126.

In this case, the anhydrous hydrofluoric acid down flow plasma processing is performed with, e.g., anhydrous hydrofluoric acid gas of 1 Torr, power of 100 W, and a process time of 5 minutes. In this embodiment, since a large amount of fluorine radicals 130 as the active etchant are formed by down flow plasma processing, the SiO$_x$ layer 127 can be removed even with low-partial-pressure, short-time processing (15 minutes at 0.4 Torr and 30 minutes at 0.2 Torr).

In this processing, impingement of high-energy ions is less than in etching using RIE. Thus, damage to the TiSi$_2$ layer 126 is small, so that highly reliable contact formation is realized.

Finally, as shown in FIG. 12C, the residual TiF$_x$ layer 128 is removed by annealing in the hydrogen atmosphere to expose a clean surface of the TiSi$_2$ layer 126. Thereafter, after the TiSi$_2$ layer 126 is heated to 350° C., SiH$_4$ and WF$_6$ are supplied onto the contact hole while the TiSi$_2$ layer is maintained at this temperature, thereby selectively forming a W layer 129 on the TiSi$_2$ layer 126.

If substrate heating in accordance with infrared heating described in the sixth embodiment is employed together with this method, the residual fluoride on the TiSi$_2$ layer 126 can be further decreased. The effective temperature range of the TiSi$_2$ layer 126 is identical to that described in the sixth embodiment.

(Eighth Embodiment)

FIGS. 13A to 13D are sectional views of a semiconductor device showing in a stepwise manner a method of forming a contact electrode according to the eighth embodiment of the present invention.

Figure 13A:
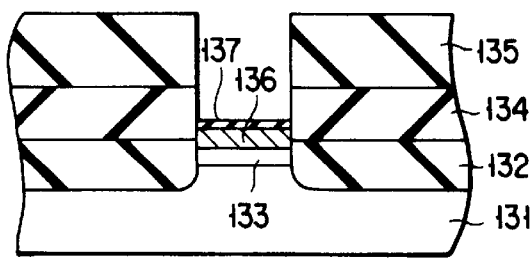
FIGS. 13A to 13D are sectional views showing in a stepwise manner a method of forming a contact electrode according to the eighth embodiment of the present invention.

As shown in FIG. 13A, a field oxide film 132 is formed on the surface of an n-type silicon substrate 131. Subsequently, a p$^+$-type diffusion layer 133 is formed on the surface of an element formation region surrounded by the field oxide film 132.

Subsequently, a stacked layer consisting of a CVD-SiO$_2$ film 134 and a BPSG film 135 is deposited as an insulating interlayer film on the entire surface and is etched, thereby forming a contact hole on the p$^+$-type diffusion layer 133. Thereafter, a native oxide film on the surface of the p$^+$-type diffusion layer 133 is separated.

A Ti film and a TiN film are continuously formed by sputtering, and silicidation with RTA processing is performed. Thereafter, the Ti film and the TiN film are removed by SH processing. As a result, a TiSi$_2$ layer 136 is formed on the p$^+$-type diffusion layer 133, and a SiO$_x$ layer 137 is further formed on the TiSi$_2$ layer 136.

Figure 13B:
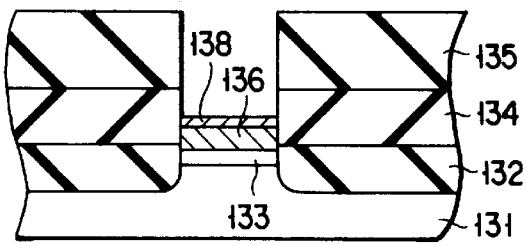

As shown in FIG. 13B, anhydrous hydrofluoric acid gas is supplied onto the TiSi$_2$ layer 136 at 1 Torr and room temperature for 10 minutes to remove the SiO$_x$ layer 137. At this time, the exposed surface of the TiSi$_2$ layer 136 is fluoridized, and a TiF$_x$ layer 138 having a low vapor pressure is formed on the fluoridized surface of the TiSi$_2$ layer 136.

Figure 13C:
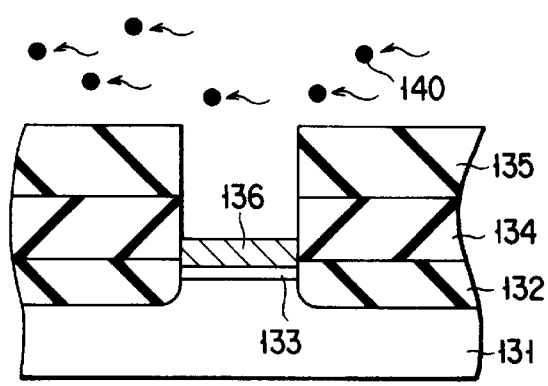

Subsequently, as shown in FIG. 13C, infrared rays B are irradiated to the lower surface of the n-type silicon substrate 131 to heat the TiSi$_2$ layer 136. Also, active hydrogen radicals 140 are formed by hydrogen down flow plasma processing using microwave discharge, thereby removing the TiF$_x$ layer 138. The conditions for this are: the hydrogen partial pressure is 0.01 Torr, the power is 100 W, the process time is 10 minutes, and the TiSi$_2$ temperature is 100° C.

Finally, as shown in FIG. 13C, after the TiSi$_2$ layer 136 is heated to 350° C., SiH$_4$ and WF$_6$ are supplied onto the contact hole while the TiSi$_2$ layer is maintained at this temperature, thereby selectively forming a W layer 139 on the TiSi$_2$ layer 136.

In this embodiment, the TiF$_x$ layer 138 is effectively removed by hydrogen down flow plasma processing at a low temperature, within short period of time, and with a low hydrogen partial pressure. A good result was obtained when the hydrogen partial pressure was 0.001 to 1 torr and the temperature of the TiSi$_2$ layer 136 was room temperature to 400° C. When hydrogen gas and a carrier gas are mixed to perform electric discharge, a larger amount of active hydrogen radicals can be supplied to the substrate surface, thereby enabling more efficient removal of the TiF$_x$ layer 138.

(Ninth Embodiment)

FIGS. 14A to 14D are sectional views of a semiconductor device showing in a stepwise manner a method of forming a contact electrode according to the ninth embodiment of the present invention.

Figure 14A:
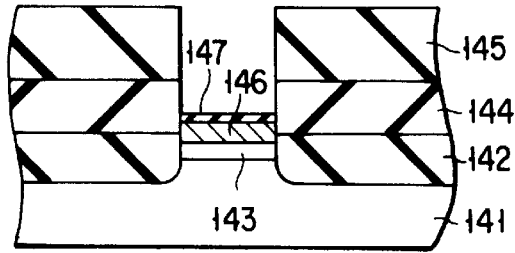
FIGS. 14A to 14D are sectional views showing in a stepwise manner a method of forming a contact electrode according to the ninth embodiment of the present invention.

As shown in FIG. 14A, a field oxide film 142 is formed on the surface of an n-type silicon substrate 141. Subsequently, p$^+$-type diffusion layer 143 is formed on the surface of an element formation region surrounded by the field oxide film 142.

Subsequently, a CVD-SiO$_2$ film 144 and a BPSG film 145 are sequentially deposited on the entire surface and are etched, thereby forming a contact hole on the p$^+$-type diffusion layer 143. Thereafter, a native oxide film on the surface of the p$^+$-type diffusion layer 143 is separated.

A Ti film and a TiN film are formed continuously, and silicidation with RTA processing is performed.

Thereafter, the Ti film and the TiN film are removed by SH processing. As a result, a TiSi$_2$ layer 146 is formed on the p$^+$-type diffusion layer 143, and a SiO$_x$ layer 147 is formed on the TiSi$_2$ layer 146.

Figure 14B:
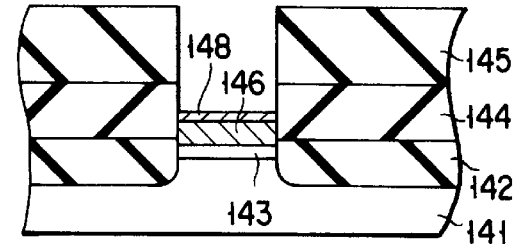

As shown in FIG. 14B, anhydrous hydrofluoric acid gas is supplied onto the TiSi$_2$ layer 146 at 1 Torr and room temperature for 10 minutes to remove the SiO$_x$ layer 147. At this time, the exposed surface of the TiSi$_2$ layer 146 is fluoridized, and a TiF$_x$ layer 148 having a low vapor pressure is formed on the fluoridized surface of the TiSi$_2$ layer 146.

Figure 14C:
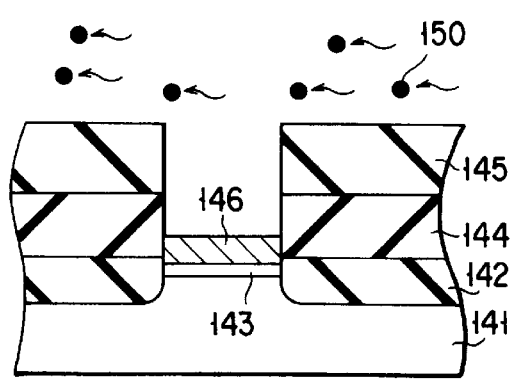
Figure 13D:
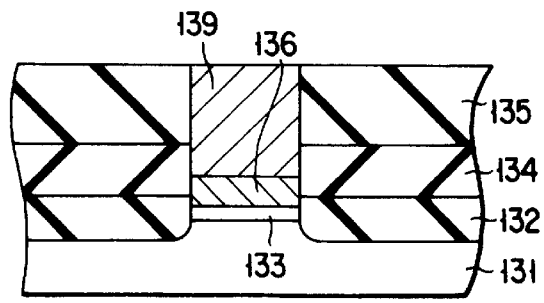
Figure 14D:
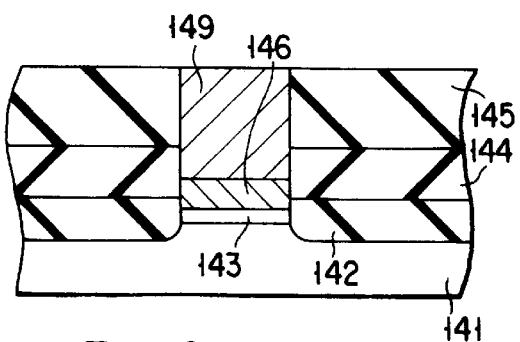

Subsequently, as shown in FIG. 14C, infrared rays C are irradiated to the lower surface of the n-type silicon substrate 141 to heat the TiSi$_2$ layer 146. Also, hydrogen atoms (H) 150 are supplied to the n-type silicon substrate 141, thereby removing the TiF$_x$ layer 148. As a result, the TiSi$_2$ layer 146 having a clean surface can be obtained.

To supply the hydrogen atoms 150, for example, tungsten heating is utilized. More specifically, tungsten is heated to make it emit thermions. Hydrogen molecules (H$_2$) dissociate in the presence of the thermions, thereby forming hydrogen atoms.

More specifically, for example, a W filament is energized by heating, and hydrogen gas is supplied to the W filament, thereby forming hydrogen atoms. Hydrogen atoms formed in this manner are supplied to the surface of the substrate. At this time, for example, the hydrogen partial pressure is 0.01 Torr, the process time is 10 minutes, and the TiS$_2$ temperature is 100° C.

Then, as shown in FIG. 14C, after the TiSi$_2$ layer 146 is heated to 350° C., SiH$_4$ and WF$_6$ are supplied onto the contact hole while the TiSi$_2$ layer is maintained at this temperature, thereby selectively depositing a W layer 149 on the TiSi$_2$ layer 146.

According to this embodiment, damage to the underlying layer due to the plasma can be decreased, in the same manner as in a case using down flow plasma, and the fluoride can be removed at a low temperature. The effective ranges of the hydrogen partial pressure and the TiSi$_2$ temperature are identical to those shown in the sixth embodiment.

(Tenth Embodiment)

FIGS. 15A to 15D are sectional views of a semiconductor device showing in a stepwise manner a method of forming a contact electrode according to the tenth embodiment of the present invention.

Figure 15A:
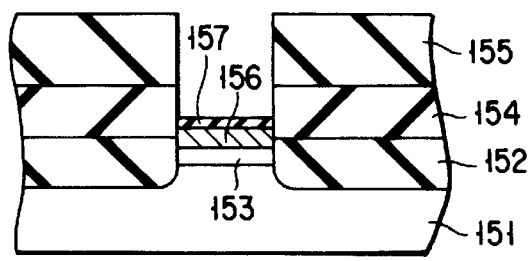
FIGS. 15A to 15D are sectional views showing in a stepwise manner a method of forming a contact electrode according to the tenth embodiment of the present invention.

As shown in FIG. 15A, a field oxide film 152 is formed on the surface of an n-type silicon substrate 151. Subsequently, a p$^+$-type diffusion layer 153 is formed on the surface of an element formation region surrounded by the field oxide film 152.

Subsequently, a CVD-SiO$_2$ film 154 and a BPSG film 155 are sequentially deposited on the entire surface and are etched, thereby forming a contact hole on the p$^+$-type diffusion layer 153. Thereafter, a native oxide film on the surface of the p$^+$-type diffusion layer 153 is separated.

A Ti film and a TiN film are formed continuously, and silicidation with RTA processing is performed. Thereafter, the Ti film and the TiN film are removed by SH processing. As a result, a TiSi$_2$ layer 156 is formed on the p$^+$-type diffusion layer 153, and a SiO$_x$ layer 157 is formed on the TiSi$_2$ layer 156.

Figure 15B:
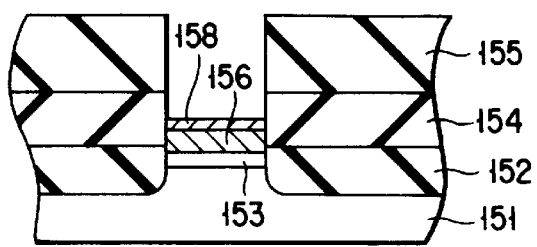

As shown in FIG. 15B, anhydrous hydrofluoric acid gas is supplied onto the TiSi$_2$ layer 156 at 1 Torr and room temperature for 10 minutes to remove the SiO$_x$ layer 157. At this time, the exposed surface of the TiSi$_2$ layer 156 is fluoridized, and a TiF$_x$ layer 158 having a low vapor pressure is formed on the fluoridized surface of the TiSi$_2$ layer 156.

Figure 15C:
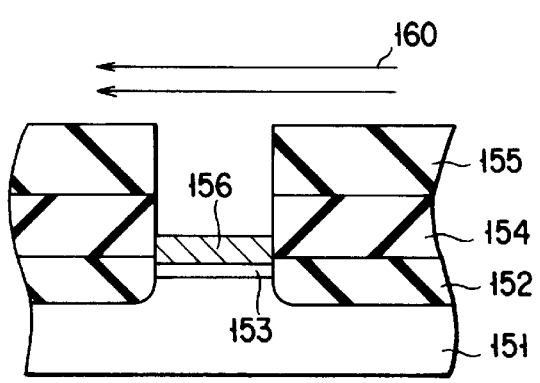

Subsequently, as shown in FIG. 15C, infrared rays D are irradiated to the lower surface of the n-type silicon substrate 151 to heat the TiSi$_2$ layer 156. Also, the n-type silicon substrate 151 is heated in a vacuum or atmosphere of a carrier gas 160, e.g., argon gas, thereby removing the TiF$_x$ layer 158.

In this case, the background water partial pressure in the vacuum or carrier gas (with a pressure of 0.035 Torr) atmosphere is 1×10$^{-6}$ Torr or less, the temperature of the TiSi$_2$ layer 156 is 250° C., and the heating time is 10 minutes.

Figure 15D:
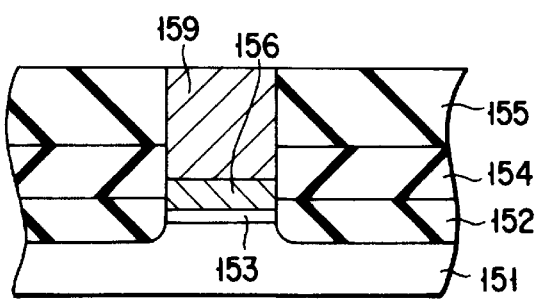

Then, as shown in FIG. 15D, after the TiSi$_2$ layer 156 is heated to 350° C., SiH$_4$ and WF$_6$ are supplied onto the contact hole while the TiSi$_2$ layer is maintained at this temperature, thereby selectively forming a W layer 159 on the TiSi$_2$ layer 156.

To obtain good contact characteristics, the hydrogen partial pressure is preferably 1×10$^{-6}$ Torr or less, and the TiSi$_2$ temperature is preferably within the range of 100 to 500° C. More preferably, the water partial pressure is 1×10$^{-6}$ Torr or less, and the TiSi$_2$ temperature is within the range of 200 to 300° C.

(Eleventh Embodiment)

Figure 16A:
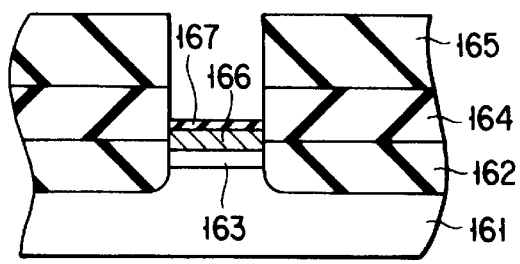
FIGS. 16A to 16C are sectional views showing in a stepwise manner a method of forming a contact electrode according to the eleventh embodiment of the present invention.
Figure 16B:
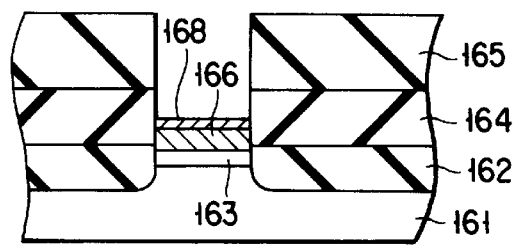
Figure 16C:
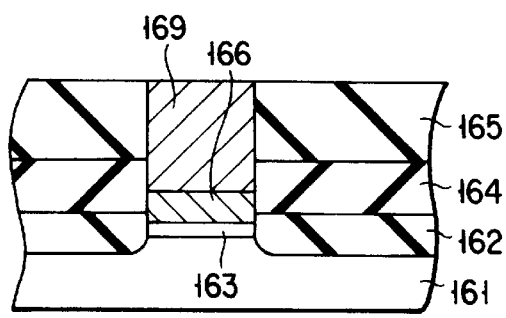

FIGS. 16A to 16C are sectional views of a semiconductor device showing in a stepwise manner a method of forming a contact electrode according to the eleventh embodiment of the present invention.

As shown in FIG. 16A, a field oxide film 162 is formed on the surface of an n-type silicon substrate 161. Subsequently, a p$^+$-type diffusion layer 163 is formed on the surface of an element formation region surrounded by the field oxide film 162.

Subsequently, a CVD-SiO$_2$ film 164 and a BPSG film 164 are sequentially deposited on the entire surface and are etched, thereby forming a contact hole on the p$^+$-type diffusion layer 163. Thereafter, a native oxide film on the surface of the p$^+$-type diffusion layer 163 is separated.

A Ti film and a TiN film are formed continuously, and silicidation with RTA processing is performed. Thereafter, the Ti film and the TiN film are removed by SH processing. As a result, a TiSi$_2$ layer 166 is formed on the p$^+$-type diffusion layer 163, and a SiO$_x$ layer 167 is formed on the TiSi$_2$ layer 166.

As shown in FIG. 16B, the SiO$_x$ layer 167 is removed not under a reduced pressure but under normal pressure by using anhydrous hydrofluoric acid gas. To remove the SiO$_x$ layer 167 under normal pressure, the anhydrous hydrofluoric acid gas may be diluted with argon gas to suppress its partial pressure. A carrier gas other than argon gas may also be used instead. For example, the conditions for the partial pressure are: the partial pressure of the anhydrous hydrofluoric acid gas is 1 Torr, the partial pressure of argon is 759 Torr, and the process time is 10 minutes at room temperature. The effective ranges of the partial pressure of the anhydrous hydrofluoric acid gas and process time are identical to those described in the fourth embodiment.

During removal of the SiO$_x$ layer 167, a TiF$_x$ layer 168 having a low vapor pressure, which is formed upon fluoridization of the exposed surface of the TiSi$_2$ layer 166, is removed by heating. For example, the TiF$_x$ layer 168 is removed by heating in a hydrogen gas atmosphere or a carrier gas atmosphere.

More specifically, supply of the anhydrous hydrofluoric acid gas is stopped and hydrogen gas is introduced into the argon atmosphere to heat the substrate, so that the TiF$_x$ layer 168 is removed under normal pressure. The effective ranges of the hydrogen gas partial pressure and heating temperature are identical to those described in the fourth embodiment. If the background water partial pressure is less than $1 \times 10^{-6}$ Torr, the TiF$_x$ layer 168 can be removed even with heating in an argon atmosphere.

Finally, as shown in FIG. 16C, after the normal pressure atmosphere is evacuated and the TiSi$_2$ layer 166 is heated to 350 w, SiH$_4$ and WF$_6$ are supplied onto the contact hole while the TiSi$_2$ layer is maintained at this temperature, thereby selectively forming a W layer 169 on the TiSi$_2$ layer 166.

In this embodiment, the effective range of the water partial pressure in the processing atmosphere, e.g., the anhydrous hydrofluoric acid gas, hydrogen gas, or carrier gas atmosphere, is $1 \times 10^{-3}$ Torr or less. More preferably, a better result can be obtained when the water partial pressure is $1 \times 10^{-6}$ Torr or less.

(Twelfth Embodiment)

Figure 17:
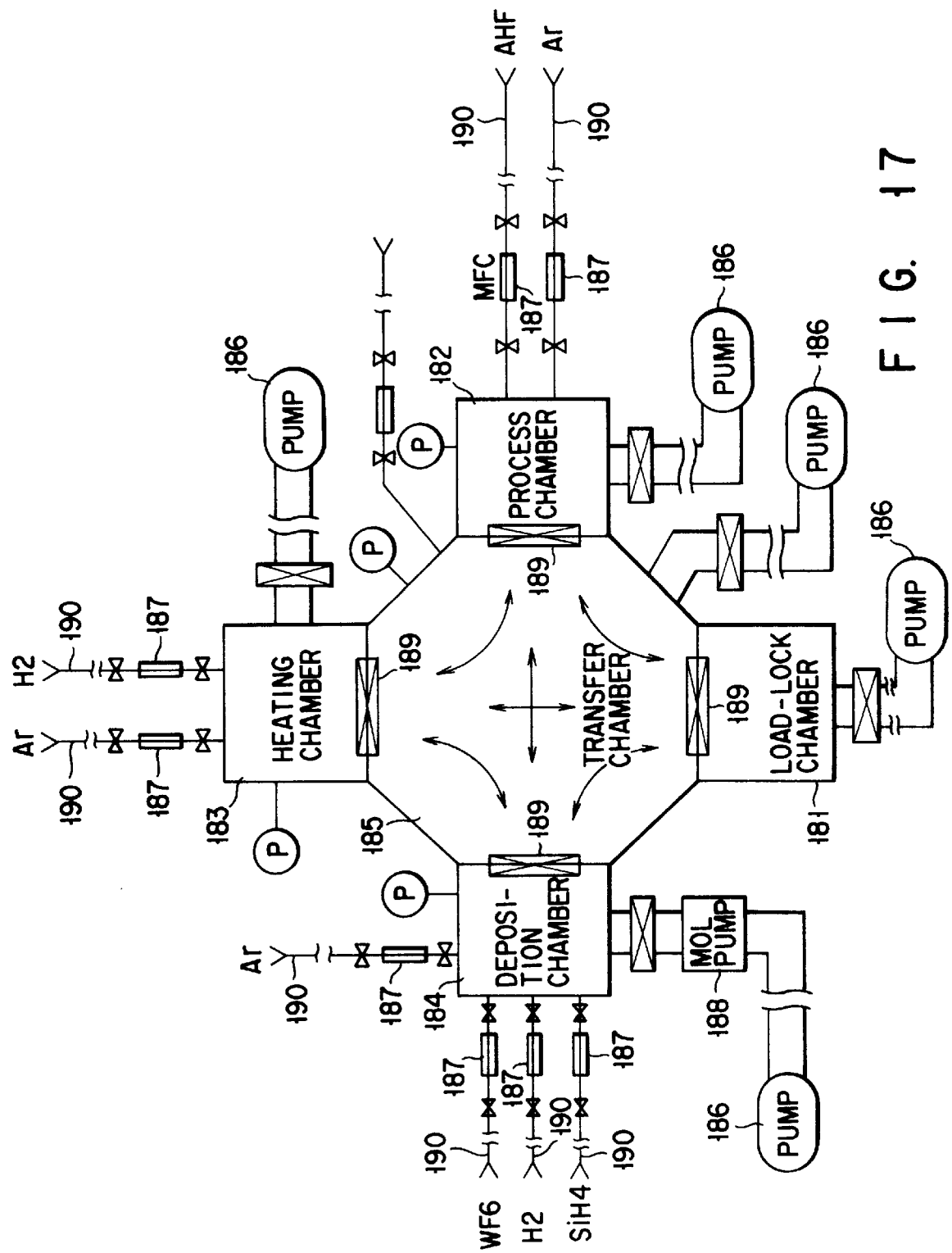
FIG. 17 is a schematic plan view briefly showing the arrangement of a semiconductor device manufacturing apparatus according to the twelfth embodiment of the present invention.
Figure 18:
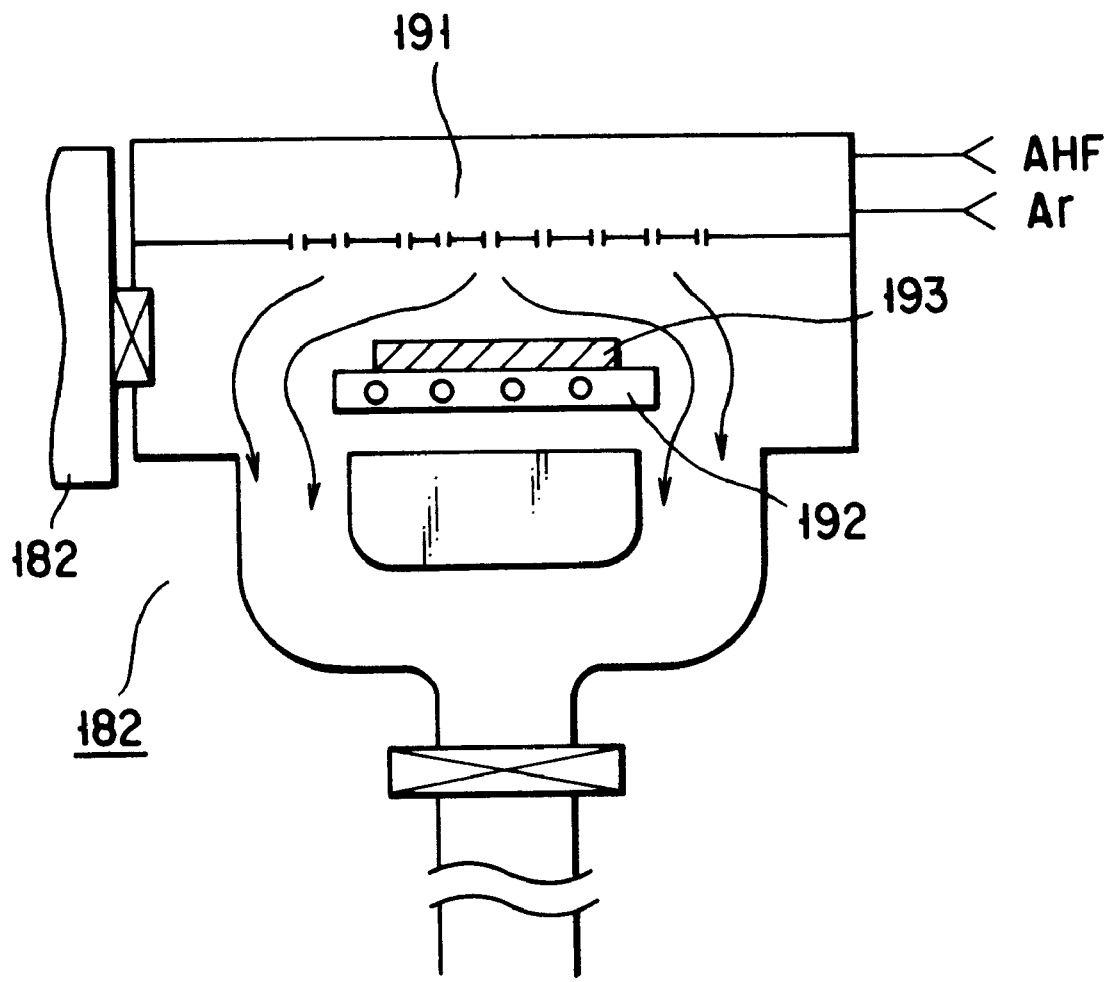
FIG. 18 is a schematic sectional view showing the detailed arrangement of the process chamber of the semiconductor device manufacturing apparatus shown in FIG. 17.

FIG. 17 is a plan view briefly showing the arrangement of a semiconductor device manufacturing apparatus according to the twelfth embodiment of the present invention, and FIG. 18 is a schematic sectional view showing the detailed arrangement of a process chamber 182 of this semiconductor device manufacturing apparatus.

The semiconductor device manufacturing apparatus of this embodiment is roughly constituted by a load-lock chamber 181, the process chamber 182, a heating chamber 183, a deposition chamber 184, and a transfer chamber 185.

The load-lock chamber 181, the process chamber 182, the heating chamber 183, and the deposition chamber 184 are connected to the transfer chamber 185 through separate valves 189. The transfer chamber 185 is provided with a transfer mechanism, thereby enabling transfer of the processing target substrate among the chambers 181 to 184.

The load-lock chamber 181, the process chamber 182, the heating chamber 183, the deposition chamber 184, and the transfer chamber 185 are provided with separate pumps 186, so that the vacuum degrees of the chambers 181 to 185 can be controlled independently of each other. In addition to the pump 186, the deposition chamber 184 is provided with a turbo-molecular pump 188.

The process chamber 182, the heating chamber 183, and the deposition chamber 184 are provided with separate gas inlet pipes 190 and mass flow controllers (MFC) 187. Thus, desired amounts of anhydrous hydrofluoric acid gas (AHF) and Ar gas can be introduced into the process chamber 182, desired amounts of H$_2$ gas and Ar gas can be introduced into the heating chamber 183, and desired amounts of WF$_6$ gas, H$_2$ gas, and SiH$_4$ can be introduced into the deposition chamber 184.

As shown in FIG. 18, a heating mechanism 192 (e.g., a resistor heater) for heating a processing target substrate 193 is provided in the process chamber 182. A multi-orifice nozzle 191 is provided above the processing target substrate 193 to oppose it. A heating mechanism (not shown) for heating the processing target substrate 193 to a predetermined temperature is provided in the heating chamber 183. An example of the heating mechanism includes, e.g., a lamp heating mechanism.

How to form a contact electrode by using a semiconductor manufacturing apparatus having the above arrangement will be described. As the processing target substrate, a silicon substrate having a TiSi$_2$ layer exposed in its contact hole is used, in the same manner as in the fourth to tenth embodiments.

First, the substrate serving as the processing target substrate is loaded in the load-lock chamber 181. Then, the interior of the load-lock chamber 181 is evacuated to a pressure of $1 \times 10^{-2}$ Torr or less.

Ar gas is supplied into the load-lock chamber 181 to maintain the pressure in the load-lock chamber 181 at 300 Torr, and the residual water partial pressure in the load-lock chamber 181 is maintained at $1 \times 10^{-5}$ Torr or less.

The substrate is loaded in the process chamber 182 through the transfer chamber 185 which is held at the same pressure as that of the load-lock chamber 181. At this time, the Ar gas is introduced into the process chamber 182 to maintain the pressure in the process chamber 182 at about 250 Torr. More specifically, during transfer of the substrate, the pressure is controlled so that the Ar gas flows from the transfer chamber 185 into the process chamber 182.

Anhydrous hydrofluoric acid gas is introduced into the process chamber 182 such that its partial pressure is 1 Torr, and oxides are removed at room temperature for 10 minutes. At this time, the flow rate of the Ar gas is controlled to 10 SLM or more, and the Ar gas and the anhydrous hydrofluoric acid gas are blown onto the substrate through the porous nozzle 191, thereby completely removing the SiO$_x$ film on the TiSi$_2$ layer. Note that the water partial pressure of the processing atmosphere is set to $1 \times 10^{-7}$ Torr or less.

Introduction of the anhydrous hydrofluoric acid gas is stopped, and the interior of the process chamber 182 is purged with the Ar gas until the residual fluorine partial pressure reaches $1 \times 10^{-5}$ Torr. Then, the substrate in the process chamber 182 is transferred into the heating chamber 183 through the transfer chamber 185.

At this time, the pressure in the transfer chamber 185, is set to 300 Torr and that in the process chamber 182 and the heating chamber 183 is set to 250 Torr. Hence, during transfer of the substrate, the gas flow direction is controlled so that the Ar gas is constantly introduced from the transfer chamber 185 into the process chamber 182 and the heating chamber 183.

The substrate loaded in the heating chamber 183 is heated by the heating mechanism. As a result, the $TiF_x$ layer formed on the surface of the $TiSi_2$ layer is removed during removal of the $SiO_x$ film, thereby obtaining a $TiSi_2$ layer having a clean surface. For example, this heating is performed at about 300° C. for 30 seconds.

The substrate is introduced from the heating chamber 183 into the deposition chamber 184 in the same manner as introduction of the substrate from the process chamber 182 into the heating chamber 183. At this time, the Ar gas is constantly supplied into the transfer chamber 185 to set the residual water partial pressure in the transfer chamber 185 to $1 \times 10^{-7}$ Torr or less at least during introduction of the substrate from the heating chamber 183 into the deposition chamber 184, so that the surface of the $TiSi_2$ layer may not be contaminated.

The interior of the deposition chamber 184 is evacuated to $1 \times 10^{-7}$ Torr, and $WF_6$ gas, $SiH_4$ gas, and hydrogen gas are introduced into the deposition chamber 184, thereby selectively forming a W layer in only the contact hole in accordance with known selective vapor deposition.

After the pressure in the deposition chamber 184 is decreased until the residual fluorine partial pressure becomes $1 \times 10^{-5}$ Torr or less, the Ar gas is introduced to a pressure of 250 Torr, and the substrate is transferred to the load-lock chamber 181, in the same manner as in the above process, thereby completing the process.

The first characteristic feature of the film deposition method employing the semiconductor device manufacturing apparatus of this embodiment resides in that three process chambers (the process chamber 182, the heating chamber 183, and the deposition chamber 184) are used continuously, so that the substrate is not brought into contact with the outer atmosphere from the outer anhydrous hydrofluoric acid process to the film deposition process.

The second characteristic feature of the film deposition method employing the semiconductor device manufacturing apparatus of this embodiment resides in that the residual water partial pressure of the atmosphere with which the substrate is brought into contact is constantly controlled to $1 \times 10^{-7}$ Torr or less.

Hence, the surface of the clean, active $TiSi_2$ layer obtained by removing the oxides can maintain its good state for a long period of time. As a result, the W film can be selectively formed uniformly in a large number of small contact holes.

The third characteristic feature of the film deposition method employing the semiconductor device manufacturing apparatus of this embodiment resides in that, during transfer of the substrate, the interiors of the transfer chamber 185 and process chambers are set at a pressure of a viscous flow range, and the interior of the transfer chamber 185 is set at a pressure higher than that of the process chambers.

Thus, the Ar gas (inert gas) does not flow from the transfer chamber 185 into the process chambers. Mutual contamination among the process chambers caused by residual fluorine in the process chamber 182 and the deposition chamber 184 can be prevented accordingly, thereby enabling a process having a high controllability.

In the film deposition method employing a conventional semiconductor device manufacturing apparatus, since the interiors of all of the load-lock chamber, the transfer chamber, and the process chambers (the process chamber, the heating chamber, and the deposition chamber) are set in a vacuum state, and the substrate is transferred in this state, the pressure difference among the respective chambers is less than 1 Torr. Thus, the residual fluorine in the process chamber is diffused into the transfer chamber and other process chambers. Therefore, mutual contamination among the process chambers cannot be prevented, a silicide layer having a clean surface cannot be obtained, and the problems of film separation and an increase in contact resistance cannot be solved.

In this embodiment, Ar gas is used. However, other inert gases, e.g., He, $N_2$, and the like can be used instead.

The pressures in the transfer chamber 185 and process chambers are not limited to 300 Torr and 250 Torr, respectively. It suffices if these pressures fall within the gas viscous flow range and the pressure difference among the chambers is controlled to 1 Torr or more.

In this embodiment, the W film selective forming method in accordance with vapor deposition is described. However, the present invention can also be applied to a method in which a silicon substrate (processing target substrate) is processed by using anhydrous hydrofluoric acid gas and thereafter a silicon film or a silicon oxide film is formed on the silicon substrate.

The present invention is not limited to the embodiments described above. For example, although a titanium silicide layer is used as the silicide layer in the above embodiments, the present invention can also be applied to other silicide layers.

An example of other silicide layers includes, e.g., a tungsten silicide layer, a molybdenum silicide layer, a platinum silicide layer, a palladium silicide layer, a zirconium silicide layer, a vanadium silicide layer, a hafnium silicide layer, a nickel silicide layer, a cobalt silicide layer, a tantalum silicide layer, and a titanium silicide layer.

In the above embodiments, the oxide film on the $TiSi_2$ layer, which is formed during removal of the TiN film or remaining Ti film on the $TiSi_2$ layer with sulfuric acid/ hydrogen peroxide (SH) processing, is removed. In general, however, the present invention can be widely applied for removing an oxide film which is formed on a silicide surface when exposing the silicide to a solvent that includes active oxygen. An example of a solution that includes active oxygen includes, e.g., a solution obtained by dissolving, as a solute, a peroxide, e.g., $H_2O_2$ or $O_3$, in a solvent, e.g., water or an organic solvent (such as alcohol). Various changes and modifications may be made without departing from the spirit and scope of the present invention.

As has been described above in detail, according to the present invention, the oxide formed on a silicide layer is removed by using anhydrous hydrofluoric acid gas, and thereafter a fluoride formed on the silicide layer during removal of the oxide is removed by heating, thereby obtaining a silicide having a clean surface and free from damage. Therefore, a conductive film having a low contact resistance and relatively free from separation can be formed on this silicide layer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising:

forming, on a surface of a silicon region, a silicon oxide film in which a total concentration of Si—H bonds, Si—O—H bonds, and $H_2O$ molecules contained therein is not less than $1 \times 10^{13}/cm^2$; and supplying an etching gas of a composition consisting essentially of anhydrous hydrofluoric acid gas onto the silicon oxide film, under a reduced pressure, while heating the silicon region at a temperature within the range of from 100 to 300° C., thereby removing the silicon oxide film.

2. A method according to claim 1, wherein the step of forming the silicon oxide includes:

the step of forming a provisional silicon oxide film in which a total concentration of Si—H bonds, Si—O—H bonds, and $H_2O$ molecules contained therein is smaller than that of the silicon oxide film; and the step of removing the provisional silicon oxide film and newly forming the silicon oxide film with a solution containing active oxygen.

3. A method according to claim 2, wherein the solution containing the active oxygen is one member selected from the group consisting of a mixed solution of hydrochloric acid and hydrogen peroxide and a mixed solution of sulfuric acid and hydrogen peroxide, and ozone water.

4. A method according to claim 2, wherein the provisional silicon oxide film in which a total concentration of Si—H bonds, Si—O—H bonds, and $H_2O$ molecules contained therein is smaller than that of the silicon oxide film is a native oxide film formed on the surface of the silicon region.

5. A method according to claim 1, further comprising, after the step of removing the silicon oxide film, the step of forming one of a gate oxide film and a tunnel oxide film on the surface of the silicon region from which the silicon oxide film has been removed.

6. A method according to claim 1, wherein the step of removing the silicon oxide film is performed in an atmosphere having an $H_2O$ partial pressure of not more than $10^{-3}$ Torr.

7. A method according to claim 5, wherein the step of removing the silicon oxide film is followed, without exposing the silicon region to an air atmosphere, by the step of forming one of a gate oxide film and a tunnel oxide film on the surface of the silicon region.

8. A method according to claim 6, wherein the step of removing the silicon oxide film is performed in an atmosphere having an $H_2O$ partial pressure of not more than $10^{-5}$ Torr.

9. A method according to claim 2, wherein the step of forming a provisional silicon oxide film includes a step of using a mixed solution of sulfuric acid and hydrogen peroxide, and the step of removing the provisional silicon film and newly forming the silicon oxide film includes a step of using a mixed solution of hydrochloric acid and hydrogen peroxide.

10. A method according to claim 1, wherein the step of forming a silicon oxide film includes a step of forming the silicon oxide film using one member of ammonia and hot nitric acid.

11. A method of manufacturing semiconductor device, comprising:

forming a first silicon oxide film on a surface of a silicon region;

removing the first silicon oxide film and newly forming a second silicon oxide film, the concentration of SiH bonds, Si—O—H bonds and $H_2O$ molecules in the second oxide film being higher than that of the first silicon oxide film and not less than $1 \times 10^3/cm^2$, with a solution containing active oxygen; and supplying an etching gas of a composition consisting essentially of anhydrous hydrofluoric acid gas onto the second silicon oxide film, under a reduced pressure, while heating the silicon region at a temperature falling in the range from 100 to 300° C., thereby removing the second silicon oxide film.

12. A method according to claim 11, wherein the first silicon oxide film is a native oxide film formed on the surface of the silicon region.

13. A method according to claim 11, further comprising, after the step of removing the second silicon oxide film, the step of forming one of a gate oxide film and a tunnel oxide film on the surface of the silicon region from which the second silicon oxide film has been removed.

14. A method according to claim 11, wherein the step of removing the second silicon oxide film is performed in an atmosphere having an $H_2O$ partial pressure of not more than $10^{-3}$ Torr.

15. A method according to claim 11, wherein the step of removing the silicon oxide film is performed in an atmosphere having an $H_2O$ partial pressure of not more than $10^{-5}$ Torr.

16. A method according to claim 11, wherein the solution containing the active oxygen is one member selected from the group consisting of a mixed solution of hydrochloric acid and hydrogen peroxide, a mixed solution of sulfuric acid and hydrogen peroxide, and ozone water.

17. A method of manufacturing a semiconductor device, comprising:

forming, on a surface of a silicon region, a silicon oxide film in which a total concentration of Si—H bonds, Si—O—H bonds, and $H_2O$ molecules contained therein is not less than $1 \times 10^{13}/cm^2$; and supplying an etching gas and a carrier gas, the etching gas being of a composition consisting essentially of anhydrous hydrofluoric acid gas, onto the silicon oxide film, under a reduced pressure, while heating the silicon region at a temperature within the range of from 100° to 300° C., thereby removing the silicon oxide film.

18. A method of manufacturing a semiconductor device, comprising:

forming, on a surface of a silicon region, a silicon oxide film in which a total concentration of Si—H bonds, Si—O—H bonds, and $H_2O$ molecules contained therein is not less than $1 \times 10^{13}/cm^2$; and supplying an anhydrous hydrofluoric acid gas onto the silicon oxide film, under a reduced pressure, while heating the silicon region at a temperature within the range of from 100 to 300° C., without forming an absorbed layer thereon, thereby removing the silicon oxide film.

* * * * *

UNITED STATES PATENT AND TRADEMARK OFFICE
CERTIFICATE OF CORRECTION

PATENT NO. : 6,140,247
DATED : October 31, 2000
INVENTOR(S) : Kouichi Muraoka et al.

It is certified that error appears in the above-identified patent and that said Letters Patent is hereby corrected as shown below:

Column 26,
Line 5, "$1 \times 10^3/cm^2$" should read -- $1 \times 10^{13}/cm^2$ --.

Signed and Sealed this

Twenty-fifth Day of December, 2001

Attest:

Attesting Officer

JAMES E. ROGAN
*Director of the United States Patent and Trademark Office*